United States Patent [19]

Tateyama et al.

[11] Patent Number: 5,718,763
[45] Date of Patent: Feb. 17, 1998

[54] RESIST PROCESSING APPARATUS FOR A RECTANGULAR SUBSTRATE

[75] Inventors: Kiyohisa Tateyama; Kimio Motoda; Tatsuya Iwasaki, all of Kumamoto; Takenobu Matsuo, Kofu; Kazuki Denpoh, Nirasaki; Eiji Yamaguchi, Yamanashi-ken, all of Japan

[73] Assignees: Tokyo Electron Limited, Tokyo; Tokyo Electron Kyushu Limited, Tosu, both of Japan

[21] Appl. No.: 416,369

[22] Filed: Apr. 4, 1995

[30] Foreign Application Priority Data

| Apr. 4, 1994 | [JP] | Japan | 6-089138 |
| Jun. 2, 1994 | [JP] | Japan | 6-143841 |
| Jul. 4, 1994 | [JP] | Japan | 6-174797 |

[51] Int. Cl.$^6$ .................................................. D05C 5/00
[52] U.S. Cl. ................. 118/52; 118/56; 118/66; 118/319; 118/321; 118/323; 134/144; 134/902
[58] Field of Search ................ 118/52, 56, 66, 118/319, 321, 323; 134/902, 144

[56] References Cited

U.S. PATENT DOCUMENTS

| 5,180,431 | 1/1993 | Sugimoto et al. | 118/52 |
| 5,349,978 | 9/1994 | Sago et al. | 134/902 |
| 5,351,360 | 10/1994 | Suzuki et al. | 134/902 |
| 5,403,397 | 4/1995 | Beckers et al. | 118/52 |
| 5,439,519 | 8/1995 | Sago et al. | 118/52 |
| 5,454,871 | 10/1995 | Liaw et al. | 118/52 |

FOREIGN PATENT DOCUMENTS

| 0017813 | 2/1977 | Japan | 118/52 |
| 0152239 | 11/1981 | Japan | 134/902 |
| 1296724 | 12/1986 | Japan | 134/902 |
| 0111337 | 4/1989 | Japan | 134/902 |
| 2090523 | 3/1990 | Japan | 134/144 |
| 3022428 | 1/1991 | Japan | 118/52 |
| 4348522 | 12/1992 | Japan | 134/902 |
| 5-114555 | 5/1993 | Japan . | |
| 5200350 | 8/1993 | Japan | 118/52 |

*Primary Examiner*—Laura Edwards
*Attorney, Agent, or Firm*—Oblon, Spivak, McClelland, Maier & Neustadt, P.C.

[57] ABSTRACT

A apparatus of resist-processing a rectangular substrate including a resist coating step of supplying resist solution to the substrate, while rotating it, to form resist film at least on one surface of it and a resist removing step of jetting removing liquid, which can solve resist, to both surfaces of it at its side peripheral portions to remove the resist film from them.

7 Claims, 19 Drawing Sheets

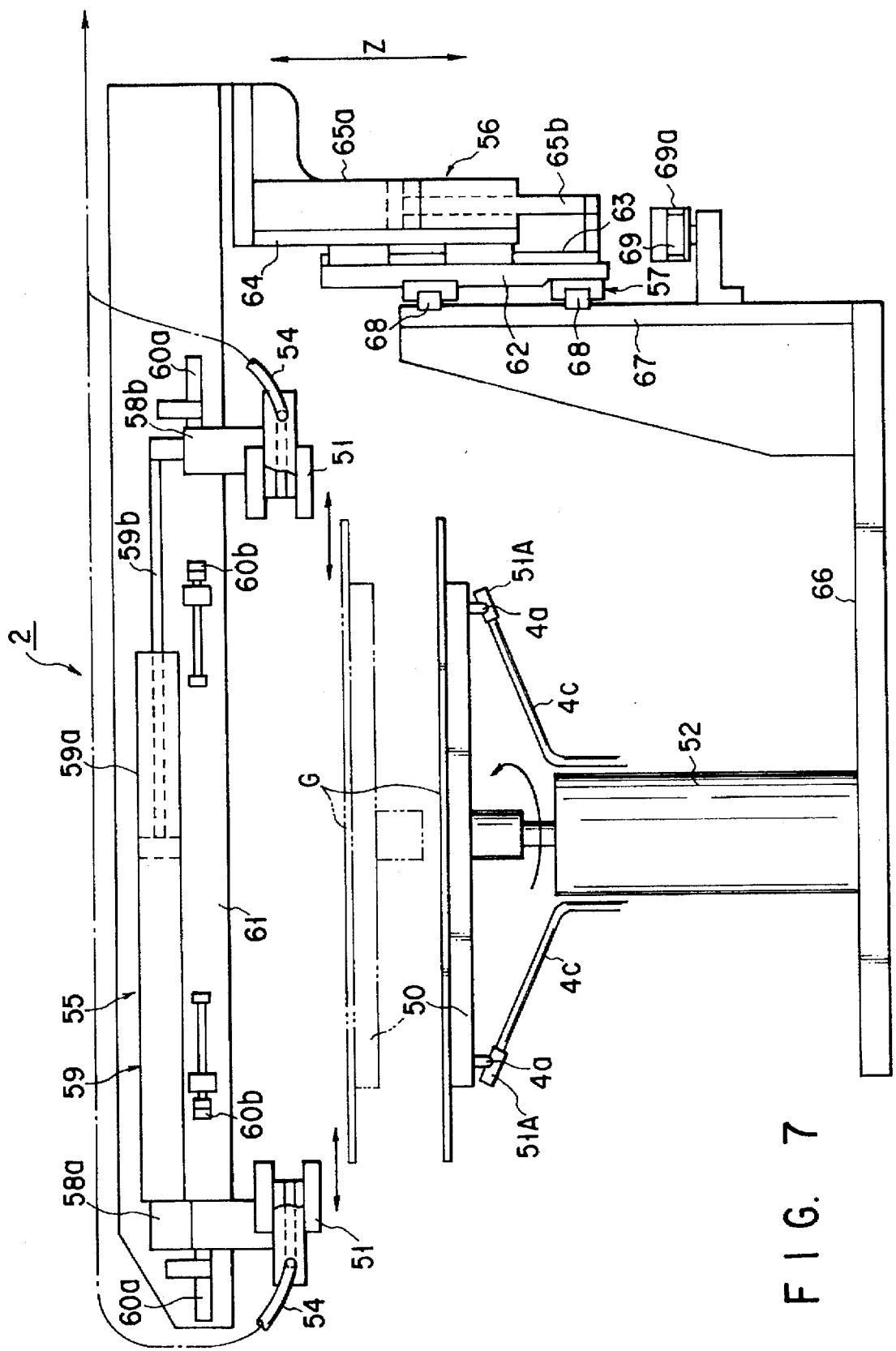
F I G. 7

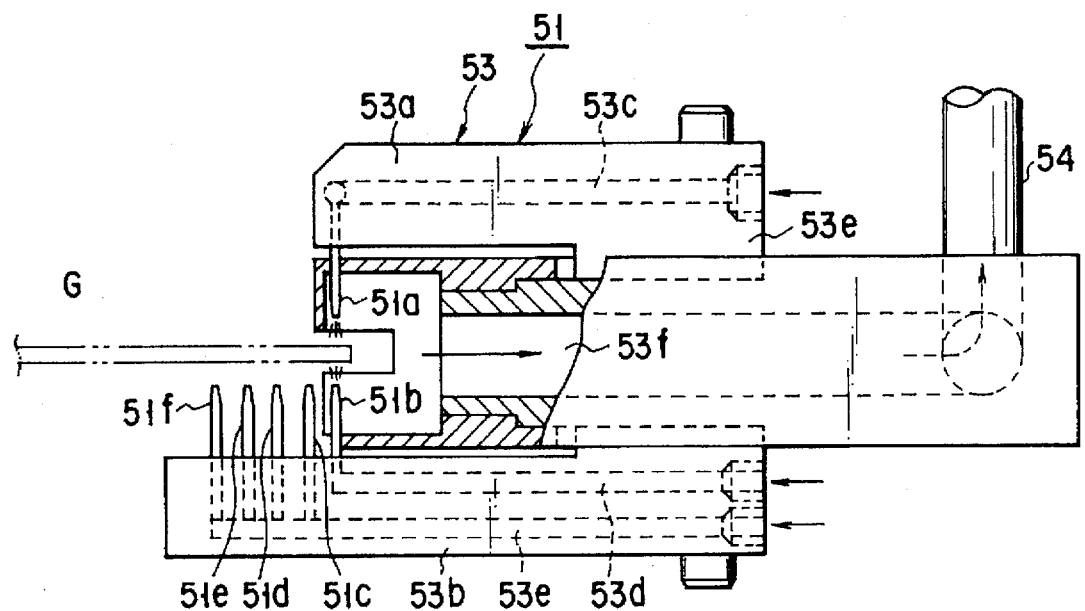
F I G. 13
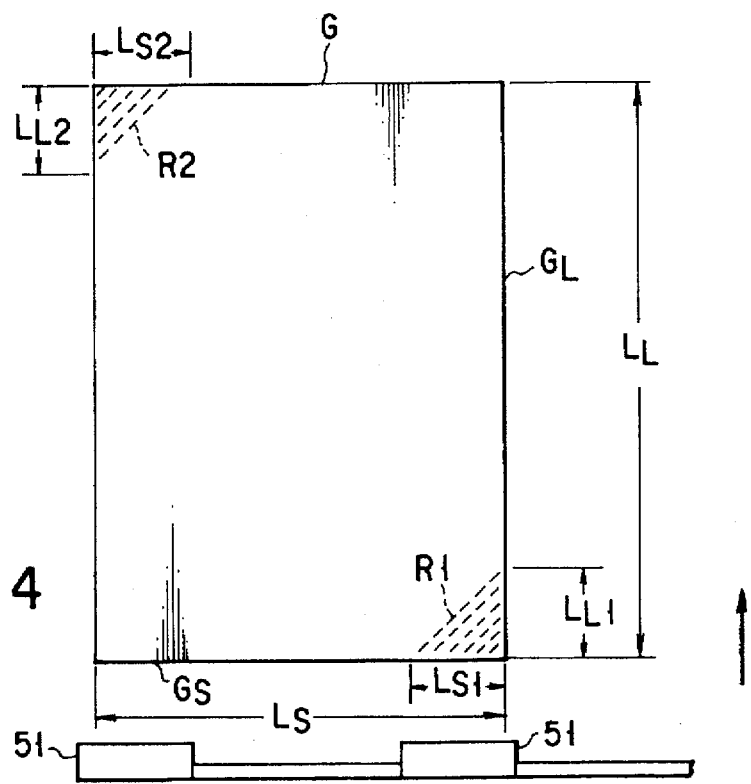
F I G. 14

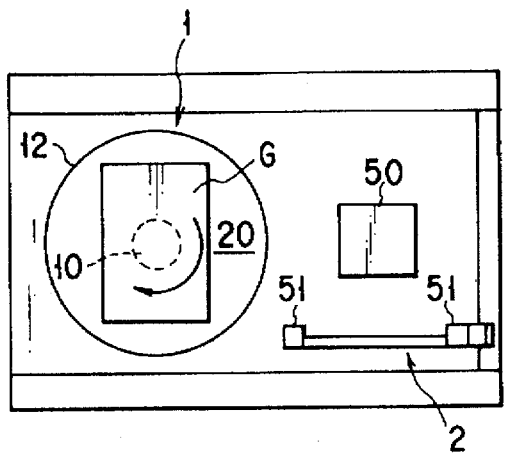
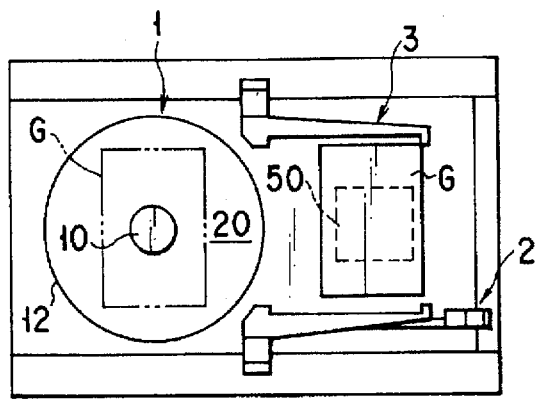
F I G. 17A                F I G. 17B
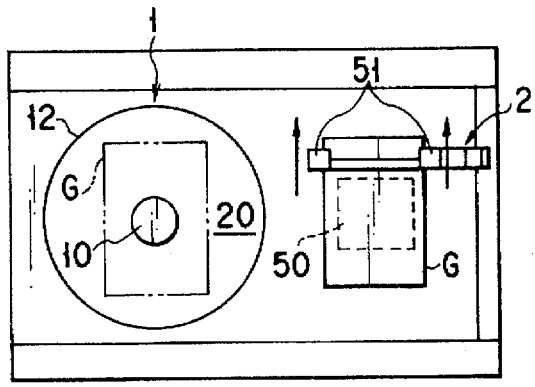
F I G. 17C
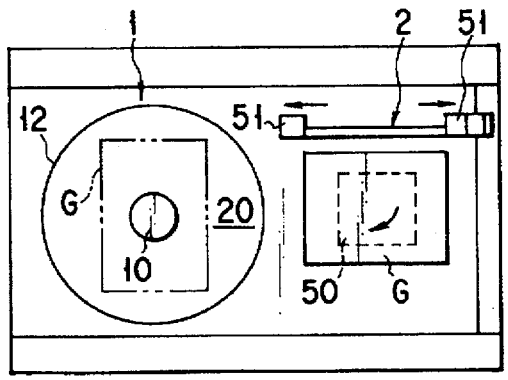
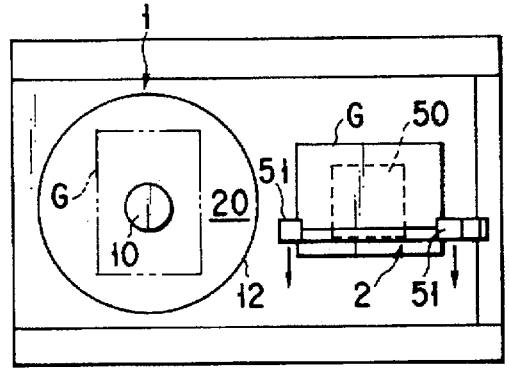
F I G. 17D                F I G. 17E

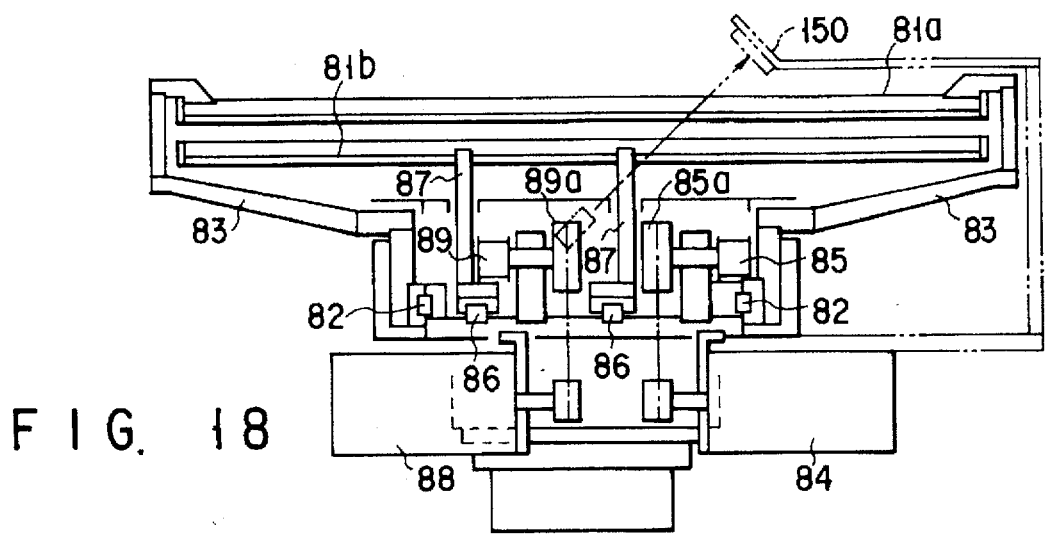
F I G. 18
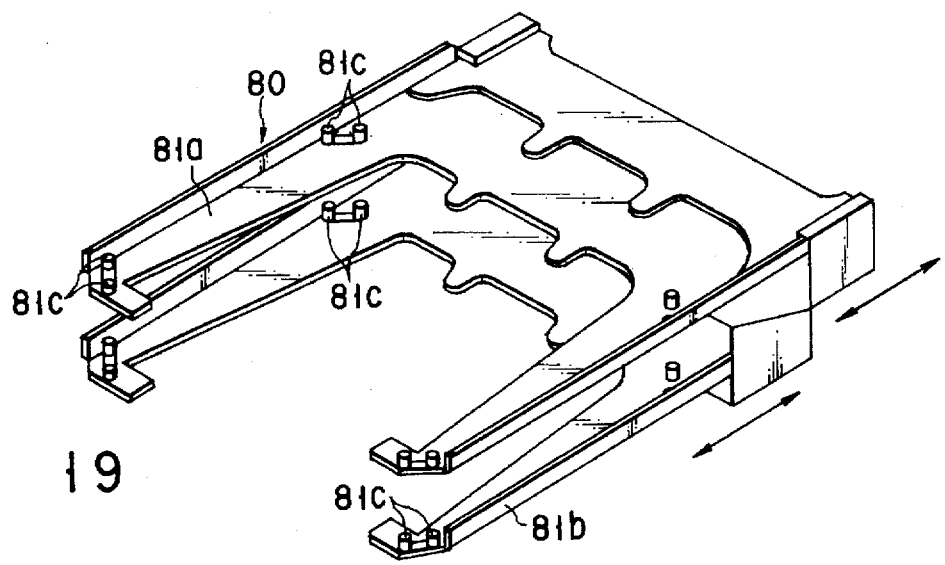
F I G. 19
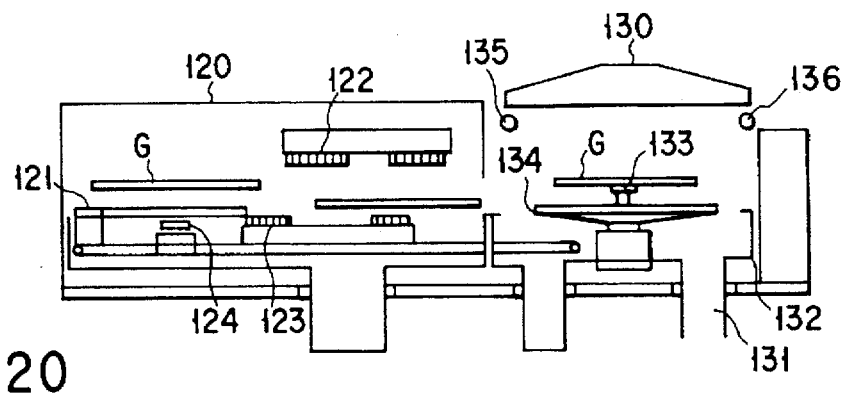
F I G. 20

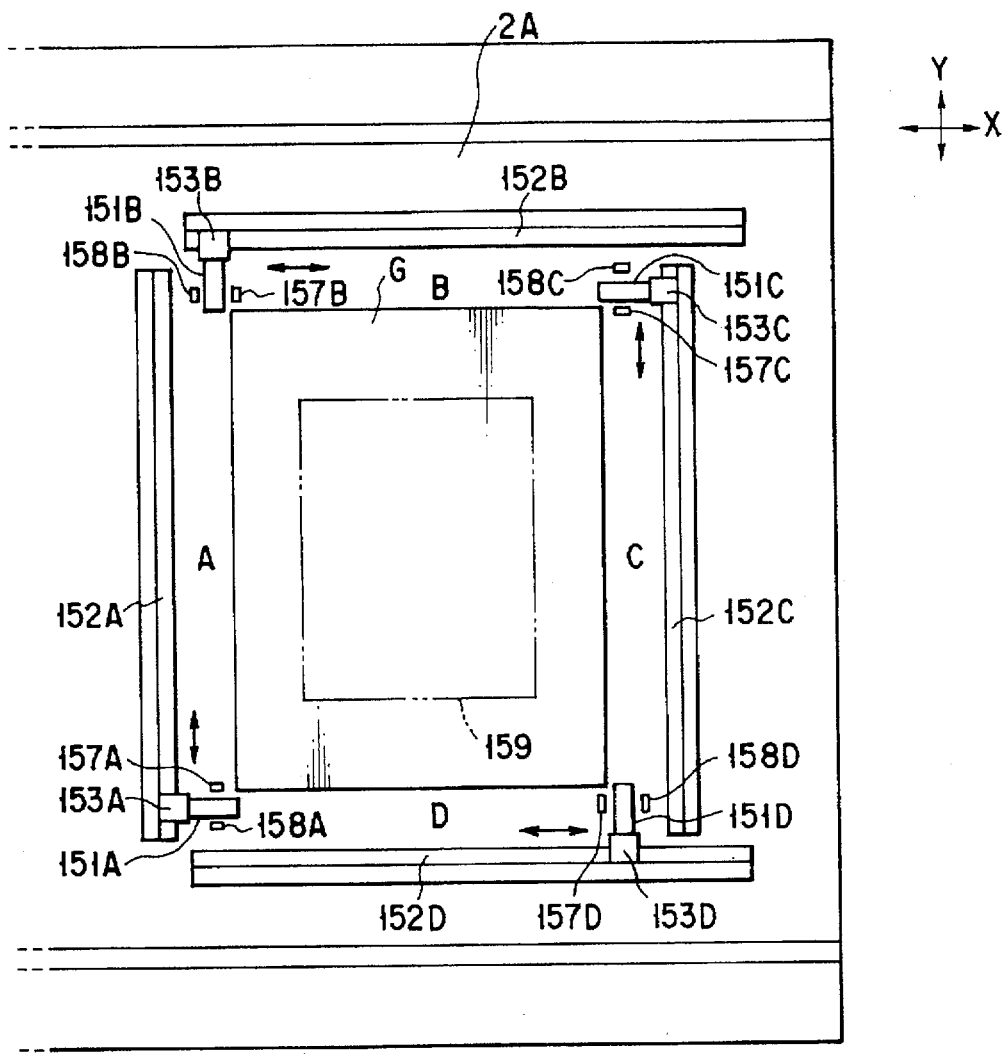
F I G. 23
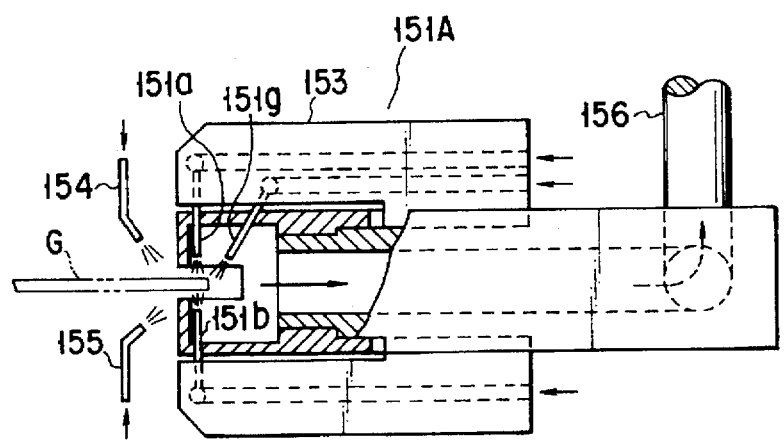
F I G. 24

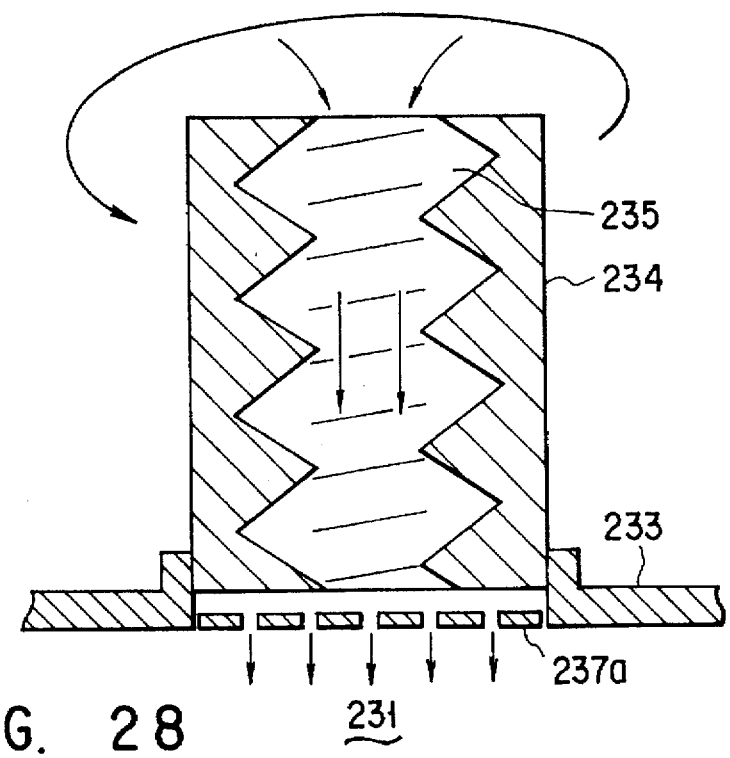
F I G. 28
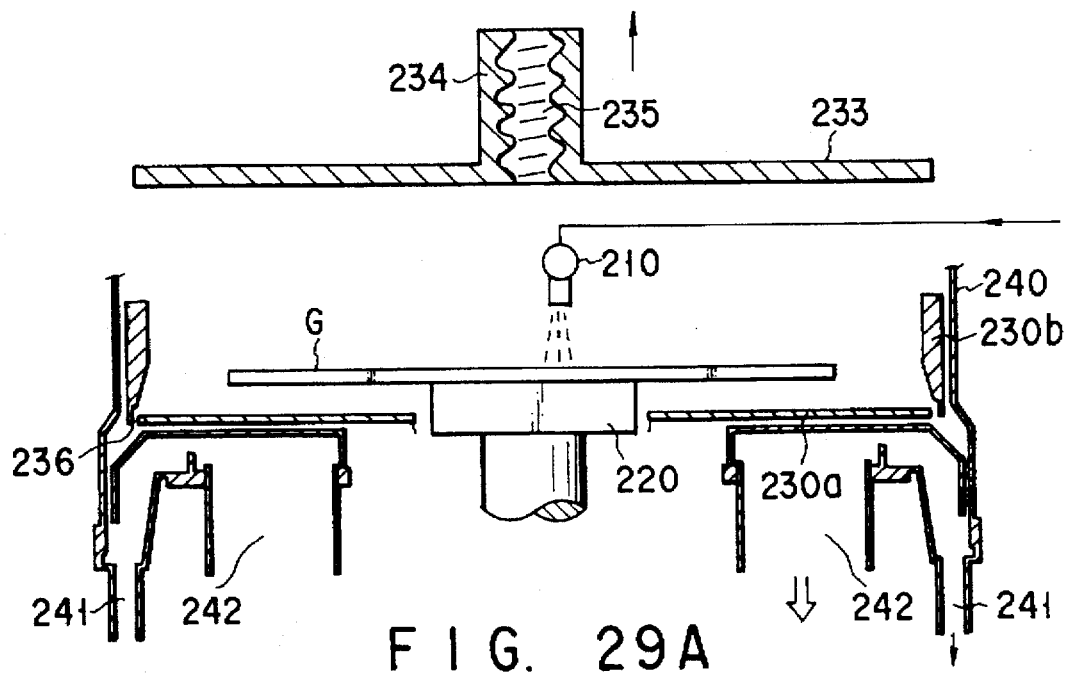
F I G. 29A

RESIST PROCESSING APPARATUS FOR A RECTANGULAR SUBSTRATE

BACKGROUND OF THE INVENTION

1. Field of the Invention

The present invention relates to method and apparatus for coating each rectangle-shaped substrate, which is to be processed, with a coating solution.

2. Description of the Related Art

Same photolithographic technique and development as those used in the course of manufacturing semiconductor devices are employed to form thin ITO (indium tin oxide) film and electrode patterns on each glass substrate in making liquid crystal display (LCD) devices. Applied to each pattern-transferred LCD substrate are a series of cleaning, adhesion, cooling, resist coating, baking, exposing, developing and rinse cleaning treatments or processes.

As time goes by after the coating process is finished, the resist film thickness becomes larger at the peripheral portion of the substrate than at the center portion thereof, thereby becoming uneven as a whole. Particularly in the large-sized LCD substrates, the resist film thickness becomes more remarkably uneven. When the resist film formed at the peripheral portion of the substrate is thick, a part of it is more likely to be left on the peripheral portion of the substrate at the resist removing process which will be conducted later. In addition, resist solution comes over the underside of the substrate and the resist thus adhering to the underside of the peripheral portion is not removed but left there at the resist removing process. These resist films left are peeled off from the LCD substrate, while it is being transported, thereby becoming particles. These particles contaminate the substrates.

In order to prevent resist film from becoming particles, it is removed from the peripheral portion of the substrate after it is coated. Solvent or the like is blown onto the peripheral portion of the substrate through nozzles at this coated-film removing process.

For the purpose of removing the coated-film from the peripheral portion of the substrate, however, the nozzles must be moved relative to each side of the substrate. It takes a lot of time and labor.

Further, resist solution which has once been separated from the substrate sometimes adheres back to the substrate again when the substrate is spin-rotated at high speed to centrifugally separate unnecessary coating solution. This back-adhering of resist solution is caused at the corners of the substrate because the substrate is shaped like a rectangle. The back-adhering resist is a cause for generating particles.

Furthermore, the coating/developing process system is made large in size and its throughput becomes low when the coated-film removing unit is incorporated into it.

In the case of the conventional spin coating and spraying methods, the amount of exhaust from the process vessel, the rotating force of it and the amount of resist solution supplied are adjusted to control the resist film thickness.

In resist-coating the LCD substrates, however, it is difficult to control the thickness of film coated, because turbulent flow is caused adjacent to the substrate, when it is being rotated, to thereby change the condition under which the system is driven and because the amount of safety solvent used is asked to become large to thereby change the solvent used. For example, those solvents which have a high vapor pressure become more easily dried. These of the ECA group (group of ethylene glycol monoethyl ether acetate) are different in film thickness from those of the PGMEA group (group of propylene glycol monoethyl ether acetate). It is therefore quite difficult to uniformly control the thickness of film coated.

In addition, resist-remaining mist is caused in the process vessel at the coating process and when it becomes dried, it changes into particles. After the resist coating process, therefore, gas in the process vessel must be replaced before the tube is communicated with the clean room.

SUMMARY OF THE INVENTION

An object of the present invention is therefore to provide resist processing method and apparatus capable of more easily removing resist film from the peripheral portion of the substrate, making the throughput of coating/developing process higher and also making the apparatus smaller in size.

Another object of the present invention is to provide resist processing method and apparatus capable of controlling the thickness of resist film and also controlling atmosphere in the process vessel.

According to an aspect of the present invention, there can be provided a method of resist-processing a rectangle-shaped substrate comprising a resist coating step of supplying resist solution to the substrate, while spin-rotating the substrate, to form resist film at least on one surface of the substrate; and a resist removing step of jetting removing liquid, which can solve the resist, to the peripheral portions of both surfaces of the substrate to remove the resist film from the peripheral portions.

It is desirable at the resist removing step that the removing liquid is simultaneously blown onto the peripheral portions of the substrate at four sides. When so arranged, the resist film can be removed from said peripheral portions on the both side faces of the substrate by one step to thereby enhance the throughput. It may be arranged that the removing liquid is simultaneously blown onto the peripheral portions of the substrate at two opposed sides and then onto the other peripheral portions thereof at other two opposed sides. It is desirable that the resist film is removed from the substrate over an area spreading 5–10 cm from the outer rim thereof. It is desirable that the removing liquid is thinner, acetone, methyl ethyl ketone, MMP, butyl acetate, ethyl lactic acid or propylene glycol monoethyl ether acetate (PGMEA).

According to another aspect of the present invention, there can be provided an apparatus for resist-processing a rectangle-shaped substrate comprising means for coating resist solution to the substrate while spin-rotating substrate and means for removing the resist from the substrate, the removing means including nozzle means for blowing removing liquid, which can solve the resist film, to the peripheral portion of the substrate, means for moving the nozzle means along the peripheral portion of the substrate, and means for carrying the substrate between the resist coating and removing means.

According to a further aspect of the present invention, there can be provided a method of resist-processing a rectangle-shaped substrate comprising spin-rotating the substrate while supplying resist solution to the substrate in a process vessel, exhausting the process vessel while introducing outside air into the process vessel to generate air current, in it and above the substrate, flowing from the center portion to the peripheral portion while coating the substrate with the resist, and replacing atmosphere in the process vessel by outside air after the resist coating is finished.

According to a still further aspect of the present invention, there can be provided an apparatus for resist-processing a rectangle-shaped substrate comprising a process vessel provided with a stage on which the substrate is mounted, means for supplying resist solution to the substrate on the stage, means for spin-rotating the stage, means provided with an exhausting passage arranged adjacent to the peripheral portion of the substrate to exhaust the process vessel through the passage, and means for introducing outside air into the process vessel.

The passage through which outside air is introduced into the process vessel may be shaped like a pipe, spiral or screw groove.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a perspective view showing a peripheral portion removing mechanism of the process apparatus;

FIG. 13 is a side view showing a part of further auxiliary cleaning nozzles sectioned to more concretely explain how the cleaning is carried out;

FIG. 14 is a plan view showing a substrate and removing nozzles;

FIGS. 17A through 17E are plan views showing the process apparatus to explain how the process method advances;

FIG. 18 is a perspective side view showing a main arm drive unit;

FIG. 19 is a perspective view showing the main portion of a main arm;

FIG. 20 is a perspective view showing a cleaning unit in the coating/developing system;

FIG. 23 is a plan view showing a variation of the peripheral portion removing mechanisms;

FIG. 24 is a sectional view showing a variation of the removing nozzles partly cut away;

FIG. 28 is a vertically-sectioned view showing a passage through which outside air is introduced; and FIGS. 29A through 29C are plan views showing the process apparatus to explain how the process method advances.

DETAILED DESCRIPTION OF THE PREFERRED EMBODIMENTS

Referring to the accompanying drawings, a resist process apparatus according to the present invention and which is incorporated into the resist processing system for LCD substrates will be described.

Figure 1:
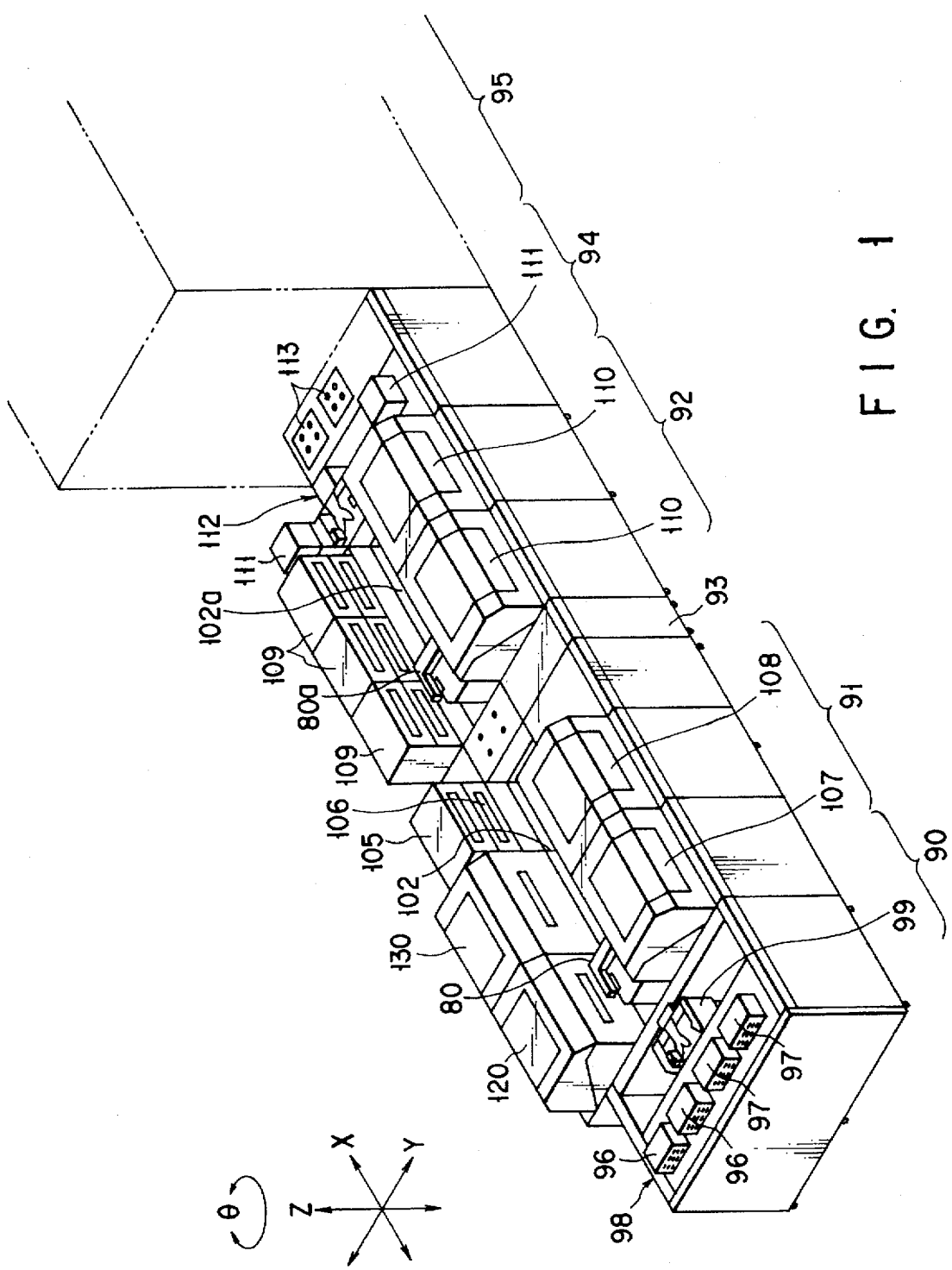
FIG. 1 is a perspective view showing the whole of a coating/developing system.
Figure 2:
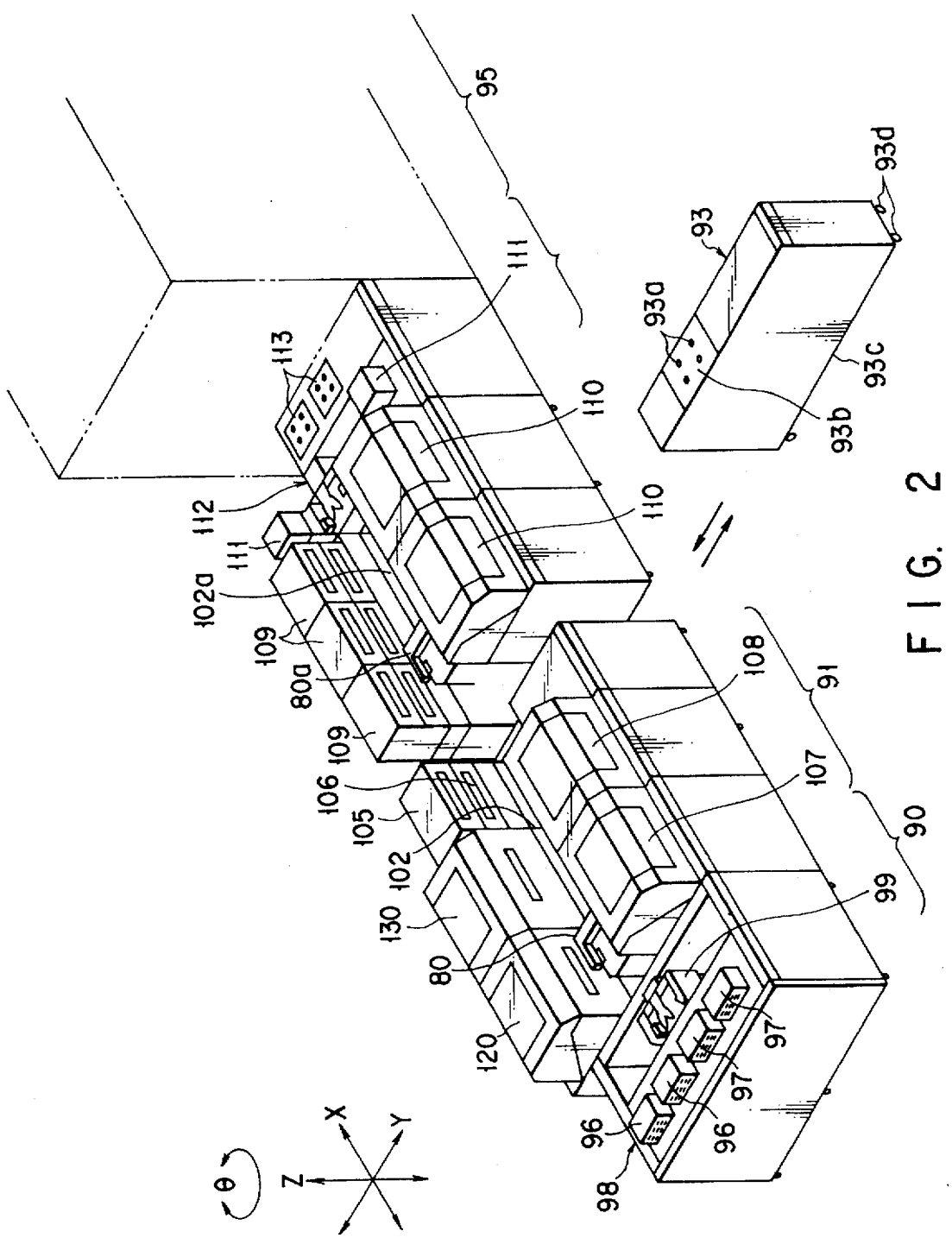
FIG. 2 is a perspective view showing the whole of the coating/developing system from which a process unit is pulled out.

As shown in FIG. 1, the resist process system includes a load/unload section 90, first and second process sections 91 and 92, an intermediate section 93 and an interface section 94. The system is connected to an exposing apparatus 95 (not shown) through the interface section 94. As shown in FIG. 2, casters 93d are attached to the bottom of a box 93c for the intermediate section 93, which can be pulled out from between the first and second process sections 91 and 92, if necessary. A transfer table 93b is arranged on the top of the intermediate section 93. It has plural pins 93a for supporting a substrate G. The load/unload section 90 includes a cassette station 98 and a transfer unit 99. Two loading cassettes 96 and two unloading cassettes 97 are arranged on the cassette station 98. A plurality of LCD substrates G are housed in each of them.

The first and second process sections 91 and 92 have a common center passage 102, 102a and a plurality of process units are arranged on both sides of the center passage 102, 102a. The first and second process sections 91 and 92 are connected to each other through the intermediate section 93. The transfer section 94 is connected to the rear side of the second process section 92. It includes a cassette 111 in which substrates G are kept waiting, a carrier pincette 112 for carrying the substrate G into and out of the cassette 111, and a transfer table 113.

Figure 22:
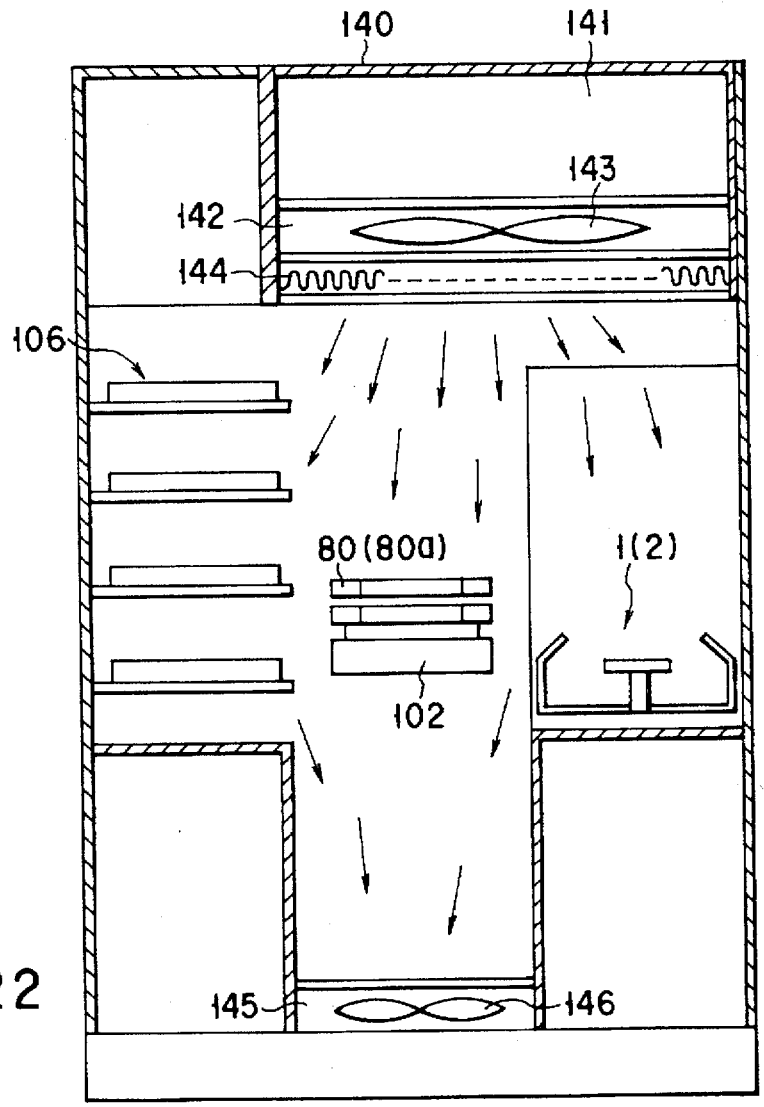
FIG. 22 is a perspective view showing a process section in the coating/developing system.

As shown in FIG. 22, the first and second process sections 91 and 92 are covered by a cover 140 and purified clean air is supplied into them, flowing from above to below. A duct 141 is arranged at an upper potion in the cover 140 and a suction fan 143 and a filter 144 are arranged in a passage 142, which passes through the duct 141 and the process sections, to supply purified air into them. When the first process section 91 will be cited as an example to be explained, an exhaust passage 145 is arranged on the bottom of the common center passage 102, 102a. An exhaust fan 146 is arranged in the exhaust passage 145. After passing through the center passage 102, cooling and adhesion process units 106, 105, scrubbing units 120, 130 and resist coating/removing units 107, 108, clean air is exhausted outside through the floor. A main arm mechanism 80 is arranged, movable along axes X, Y and Z and rotatable in a direction θ, in the center passage 102.

On the other hand, same main arm mechanism 80a is also arranged in the center passage 102a at the second process section 92. Heating process units 109 are arranged on one side of the center passage 102a to pre- or post-bake the substrates G. Also arranged on the other side of the center passage 102a are developing units 110.

The resist coating/removing unit 107 will be described as an example, referring to FIG. 3.

A resist coating mechanism 1, a carrier mechanism 3 and a resist removing mechanism 2 are arranged in the resist coating/removing unit 107. Guide rails 71 for the carrier mechanism 3 extend from the resist coating mechanism 1 to the resist removing mechanism 2. The carrier mechanism 3 has a pair of arms 70 and runs on the rails 71.

The resist coating mechanism has a nozzle 1a through which resist solution is jetted onto the surface of the LCD substrate G. A spin chuck 10 is arranged in a process vessel 20 to attract and hold the substrate G and also rotate it in the direction θ.

The resist removing mechanism 2 has a pair of nozzles 51 and a rotatable stage 50. The paired nozzles 51 are communicated with a removing liquid supply source (not shown) through a passage. Liquid such as thinner by which resist film can be solved is stored in the removing liquid supply source. To add more, atmosphere in the resist coating/removing unit 107 can be controlled.

It will be described how the substrate G is brush-cleaned.

Figure 21:
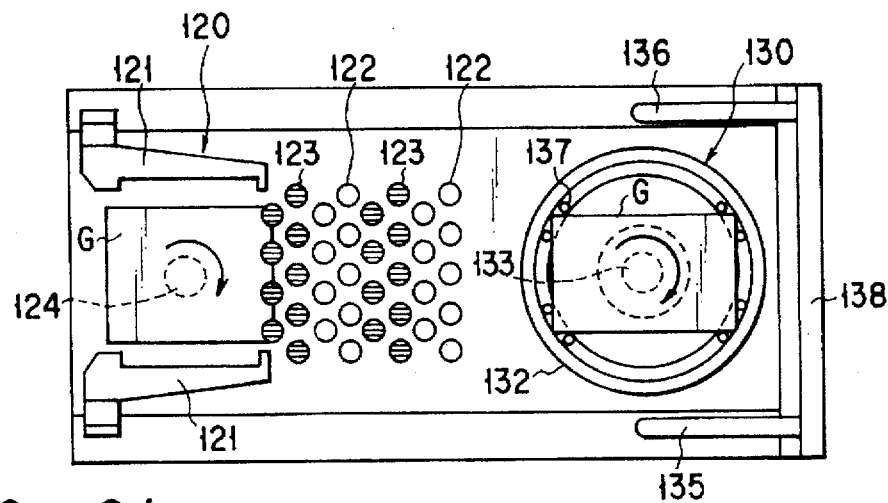
FIG. 21 is a plan view showing the cleaning unit.

As shown in FIG. 21, the substrate G is carried between surface and underside cleaning brushes 122 and 123 by a substrate carrier arms 121 and pure water is jetted as rinsing liquid while rotating these brushes 122 and 123. An arm drive motor (not shown) is driven alternately forward and backward to move the substrate G forward and backward. The substrate G is then carried to a jet water cleaning unit 130 and transferred onto a disc stage 134 by a substrate holder mechanism 133. A cleaning water supply nozzle 136 is moved above the substrate G and high pressure jet water is then jetted to the substrate G through the nozzle 136. This cleaning process is carried out while rotating the substrate G at low speed. The cleaning water supply nozzle 136 is then retreated, a rinse liquid supply nozzle 135 is moved above the substrate G, and rinsing liquid such as pure water is jetted to the substrate G through the nozzle 135.

The resist coating mechanism 1 in the resist coating/removing unit 107 will be described with reference to FIGS. 4 and 5.

The spin chuck 10 of the resist coating mechanism 1 is enclosed by a rotary cup 12. The rotary cup 12 has an open top and it is shaped like a cylinder having a bottom. Its open top is closed by a cap 16. A hollow ring-shaped drain cup 14 encloses the rotary cup 16 and it can be exhausted.

The spin chuck 10 is supported by a rotary shaft 22, which is connected to a drive shaft for a motor 21 through belt mechanisms 28a and 29a. The rotary shaft 22 is made hollow and this hollow passage is communicated with a vacuum pump (not shown). On the other hand, the hollow passage in the rotary shaft 22 is opened at the top of the spin chuck 10. When the LCD substrate G is mounted on the top of this spin chuck 10, it is vacuum-sucked on the top of the spin chuck 10. Reference numeral 30 denotes a vacuum seal section. The whole of the spin chuck 10 can be moved up and down by a lift cylinder 23.

The rotating shaft 22 is slidably fitted into spline shafts 27. Therefore, it can be moved up and down by the cylinder 23. An outer sleeve 26b of the spline shafts 27 is connected to the rotary cup 12 through a member 31. A pulley 28b is fitted onto the outer sleeve 26b and a belt 29b is stretched round the pulley 28b. An inner sleeve 26a is fitted onto the spline shafts 27 and a fixing collar 24 is rotatably attached to the inner sleeve 26a through bearings 25a. Further, bearings 25b are arranged between the outer sleeve 26a and the fixing collar 24. When arranged as described above, the rotary cup 12 can be rotated independently of the spin chuck 10.

On the other hand, a bottom 12b of the rotary cup 12 is fixed to the top of the outer sleeve 26b through the connecting member 31. Bearings 32 having sealing function are arranged between the bottom 12b of the rotary cup 12 and the underside of the spin chuck 10. The belt 29b is stretched between the driven pulley 28b and a drive pulley 21b and rotation force is thus transmitted to the rotary cup 12 by the motor 21. The driven pulley 28b has a diameter same as that of the driven pulley 28a and belts 29a and 29b are stretched round the common motor 21. The rotary cup 12 is thus rotated synchronizing with the spin chuck 10 in this case. It may be arranged in this case that the diameter of the driven pulley 28a is made different from that of the other driven pulley 28b to rotate the spin chuck 10 differentially from the rotary cup 12.

Figure 6:
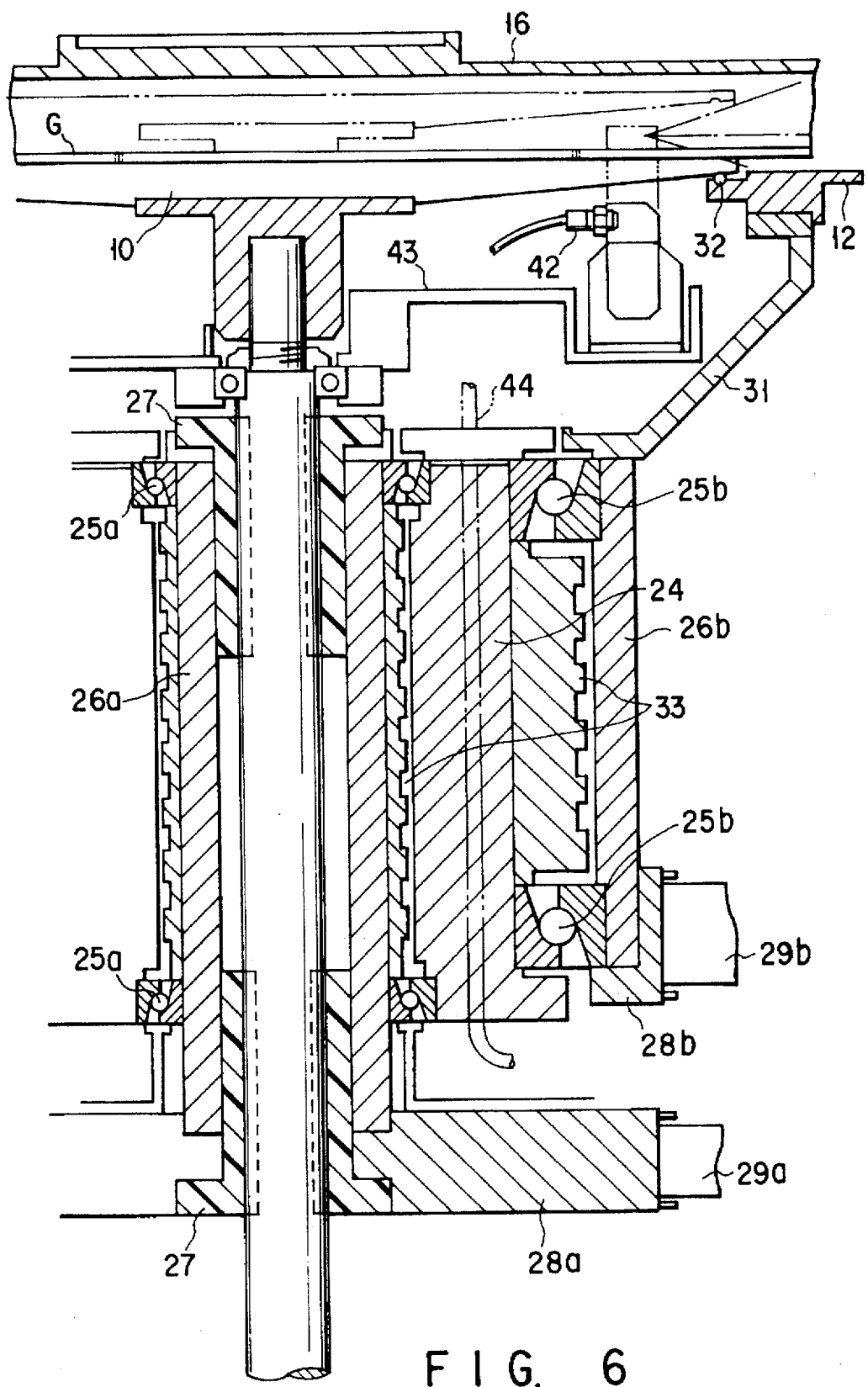
FIG. 6 is a vertically-sectioned view showing another part of the process apparatus enlarged.

As shown in FIG. 6, labyrinth seals 33 are formed between the fixing collar 24 and the inner sleeve 26a and also between the fixing collar 24 and the outer sleeve 26b. The labyrinth seals 33 prevent dust from entering into the rotary cup 12 from the lower drive system.

Figure 5:
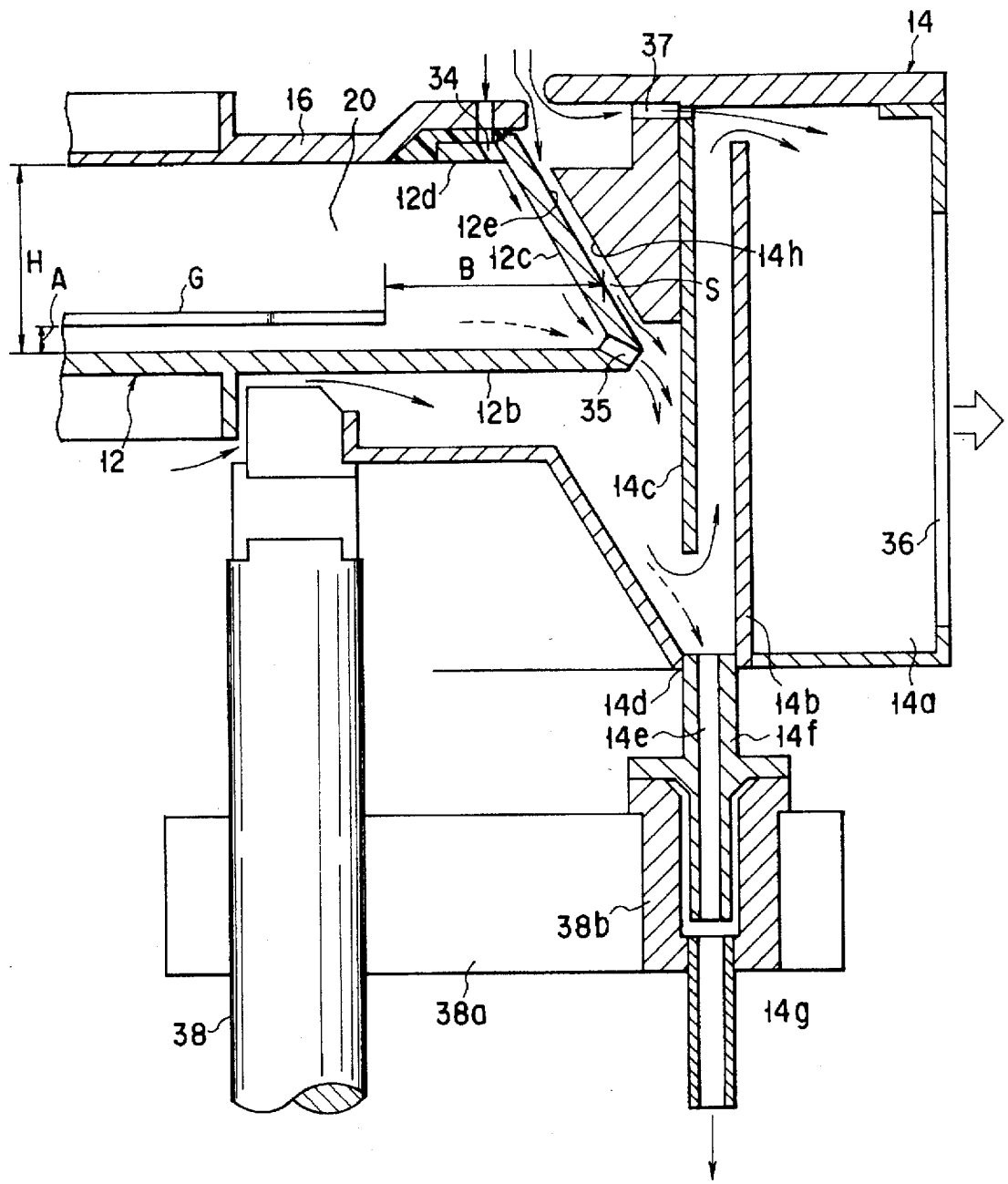
FIG. 5 is a vertically-sectioned view showing a part of the process apparatus enlarged.

As shown in FIG. 5, the rotary cup 12 has a bottom diameter larger than its top diameter. An outer circumferential wall 12c of the rotary cup 12 is tilted and an exhaust passage S which extends obliquely downward is formed between a slope 12e of the rotary cup 12 and the inner face of a ring member 14h. A flange 12d extends inward from the top of the outer circumferential wall 12c. A plurality of air supply apertures 34 are formed in the inward flange 12d along the outer rim thereof at a certain interval. Exhaust holes 35 are also formed in the lower end of the outer circumferential wall 12c along the circumferential rim thereof.

When the air supply apertures 34 are combined with the exhaust holes 35 in this manner, gas in the process chamber 20 can be exhausted outside through the exhaust holes 35 while air can flow into the process vessel 20 through the air supply apertures 34. Internal pressure of the process vessel 20 can be thus prevented from becoming too much negative while the rotary cup 12 is being rotated. In addition, the cap 16 can be thus easily released from the rotary cup 12 even after the process is finished.

The air supply apertures 34 may be formed in the center of the rotary cup 12 or cap 16. As shown in FIG. 4, for example, a plurality of air supply apertures 34A are formed in the lower end of a swelled head 18 along the circumferential rim thereof in such a way that the sum of their opening areas becomes equal to that of the air supply apertures 34.

Or a baffle plate 34B having an area larger than the substrate G may be arranged between the cap 16 and the substrate G. Entering air is thus guided to the circumferential peripheral portion of the process space 20 by the baffle plate 34B.

As shown in FIG. 5, a ring-shaped passage 14a is formed in the drain cup 14 and exhaust openings 36 are formed in the outer wall of the ring-shaped passage 14a (at four points along the circumferential rim thereof) to communicate with an exhaust unit (not shown).

Figure 4:
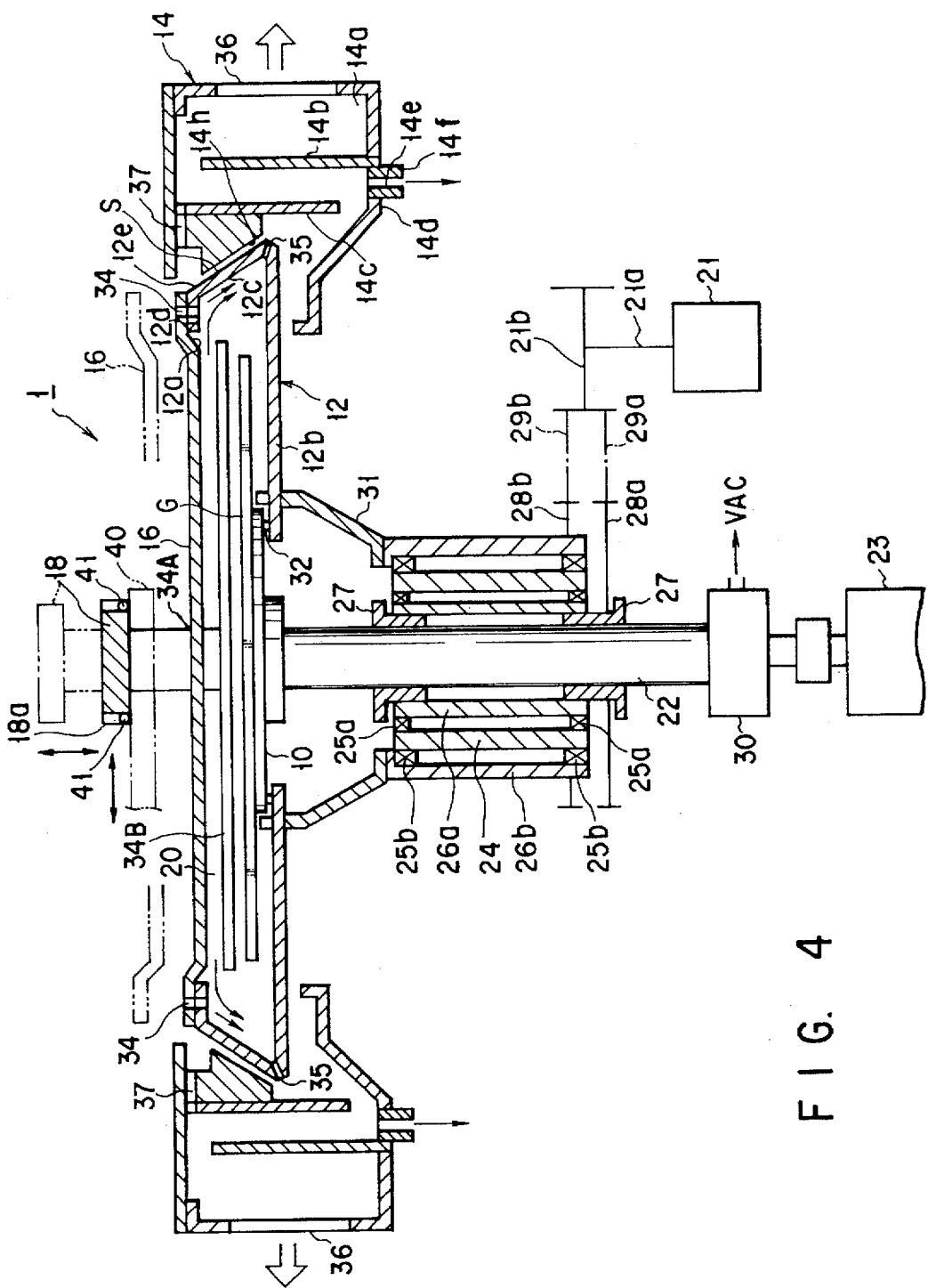
FIG. 4 is a vertically-sectioned view showing the process apparatus according to a first embodiment of the present invention.

As shown in FIGS. 4 and 6, radial exhaust passages 37 which are communicated with the exhaust openings 36 are formed in the top end of the inner wall of the drain cup 14. When the cup 12 is rotated, mist-like resist is spread in the process space 20 by centrifugal force, thereby flowing into the drain cup 14 through the exhaust holes 35. It can be thus prevented from being whirled up to the upper portion of the rotary cup 12 and it can be exhausted outside through the exhaust openings 36.

The ring-shaped passage 14a is partitioned by an outer wall 14b erected from the bottom of the drain cup 14 and by an inner wall 14c hung from the ceiling thereof. Exhausted flow is thus uniformly distributed in the drain cup 14 by these partition walls 14b and 14c. Plural drain pipes 14f are connected to drain holes 14e formed in a bottom 14d of the drain cup 14 and waste liquid is exhausted outside through these holes and pipes.

As shown in FIG. 5, each drain pipe 14f is detachably attached to a joint 38b and a liquid exhaust pipe 14g is connected to the bottom of the joint 38b. The joint 38 is held by a bracket 38a and the bracket 38a is attached to a rod 38 by which the drain cup 14 is supported.

The micro-clearance S is formed between the tapered face 12e of the rotary cup 12 and that 14h of the drain cup 14. Circumferential speed in the upper portion of the micro-clearance S is different from that in the lower portion thereof and this circumferential speed difference causes pressure difference, by which air flowing in the clearance S from above to below is further forced. Exhausted mist in the drain cup 14 can be thus prevented from spreading outside the rotary cup 12 through the micro-clearance S.

The cap 16 is rotated together with the rotary cup 12. The cap 16 is therefore fixed to the rotary cup 12 in such a way that fixing pins (not shown) projected from the top of the rotary cup 12 are fitted into their corresponding recesses in the cap 16.

As shown by two-dot and dash lines in FIG. 4, a robot arm 40 is positioned under the swelled head 18, engaging pins 41 projected from the robot arm 40 are engaged with engaged grooves 18a in the heat 18, and the robot arm 40 is then moved up and down when the cap 16 is to be opened and closed. The aligning of the engaging pins 41 of the robot arm 40 with the engaged grooves 18a in the head 18 when the cap 16 is to be opened and the aligning of the fixing pins with the recesses when the cap 16 is to be closed are achieved by the rotation control of the servo-motor 21.

When the substrate G is to be coated by resist solution, the resist solution which has been shaken off from the substrate G is stayed in the process vessel 20 at the circumferential peripheral portion thereof if no exhaust hole is provided. This makes it difficult for the coated liquid on the substrate G to become dried in the process vessel 20, thereby causing the thickness of the resist film to become uneven.

In the case of this embodiment, therefore, the rotation speed of the rotary cup 12 is made 500–2000 rpm and twenty four exhaust holes 35 each having a diameter of 4 mm are formed in the bottom of the rotary cup 12 along the outer circumferential rim thereof, to thereby control the drying of resist and the atmosphere in the process vessel 20.

Further, the process vessel 20 has a height H of 10–50 mm, an interval A is in a range of 2–10 mm, an interval B is in a range of 30–50 mm and the clearance S in a range of 1–10 mm, as shown in FIG. 5.

A cup cleaning nozzle 42 is arranged in the connector member 31 and inner faces of the rotary cup 12 and the cap 16 can be washed and cleaned through the cup cleaning nozzle 42. In short, the cup cleaning nozzle 42 is held by a bracket 43 and a cleaning liquid supply pipe 44 is connected to a cleaning liquid supply source (not shown) through an internal passage (not shown) of the fixing collar 24. When the spin chuck 10 is lifted and the cup cleaning nozzle 42 is positioned between the spin chuck 10 and the bottom of the rotary cup 12 as shown by two-dot and dash lines in FIG. 6, therefore, cleaning liquid can be jetted to the inner faces of the rotating cup 12 and cap 16 through the cup cleaning nozzle 42.

Figure 3:
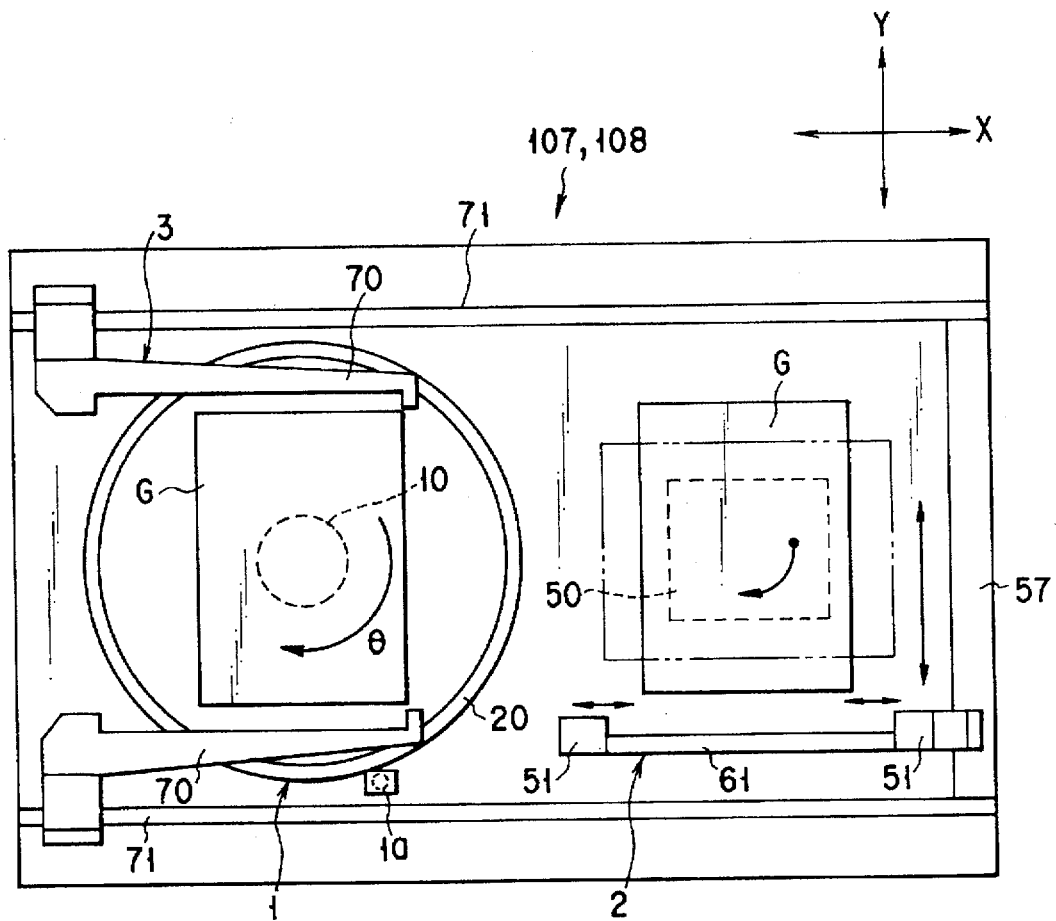
FIG. 3 is a plan view showing a process apparatus.

As shown in FIGS. 3 and 7, the resist removing mechanism 2 has the stage 50 and a pair of nozzles 51. The stage 50 can attract the substrate and it is rotatably supported. The paired nozzles 51 are arranged to jet resist solving (or removing) liquid to two opposed peripheral portions, that is, to the top and underside of these areas of the substrate G mounted on the stage 50.

The stage 50 is supported by a drive unit 52 which is provided with a motor (not shown) and a lift cylinder (not shown) or a ball screw (not shown). The stage 50 is rotated by the motor of this drive unit 52 to position two sets of two opposed peripheral portions of the substrate G just under the removing nozzles 51. In addition, it is moved up and down by the lift cylinder or ball screw to change its substrate-transferring, coated-film-removing and waiting levels.

Figure 8:
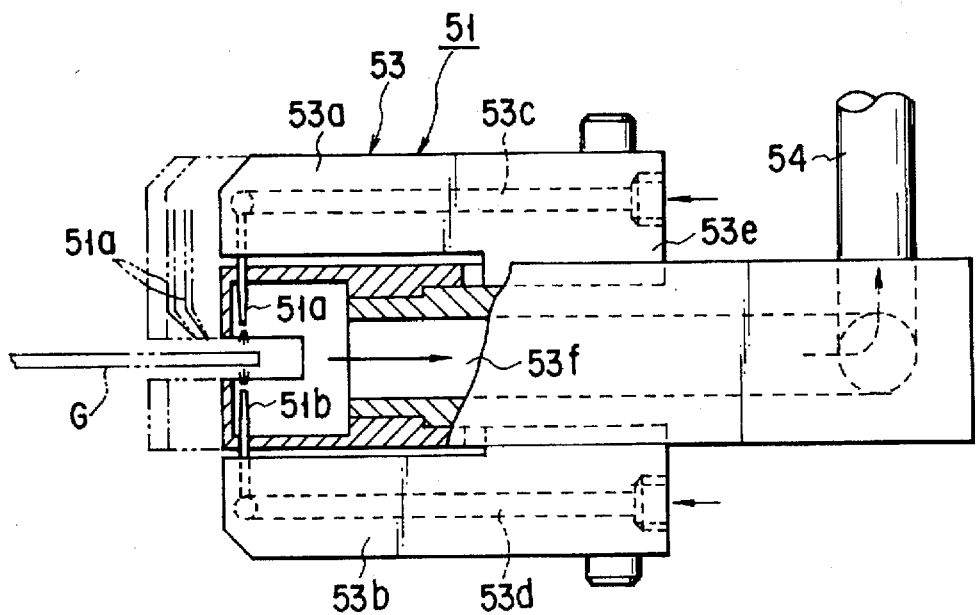
FIG. 8 is a partly-sectioned view showing a removing nozzle.
Figure 9:
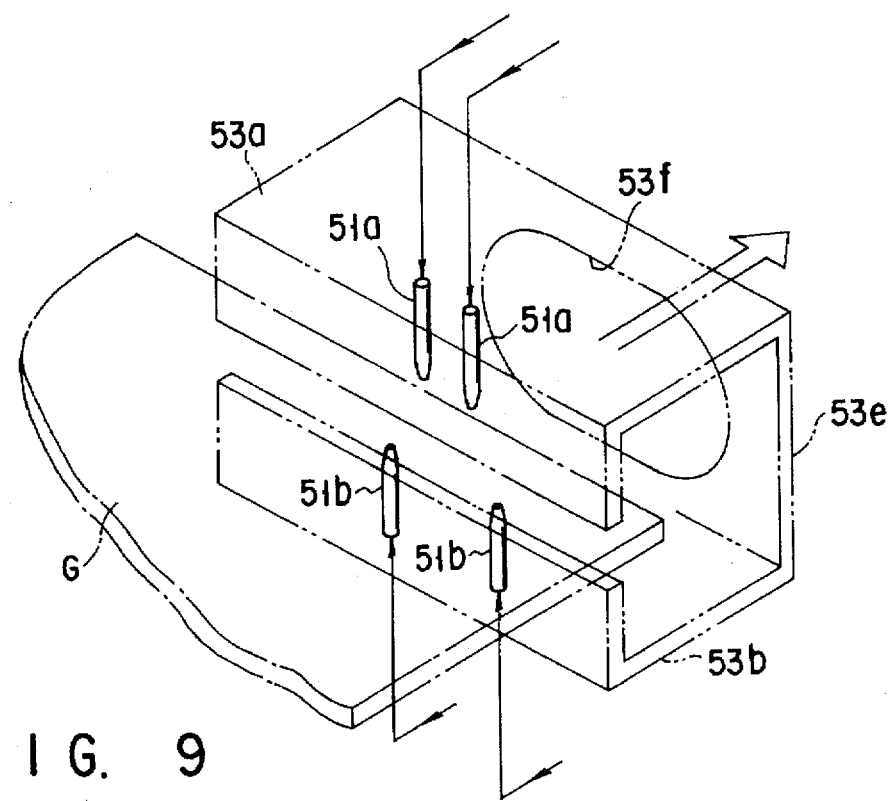
FIG. 9 is a perspective view showing how the nozzles are arranged.
Figure 10:
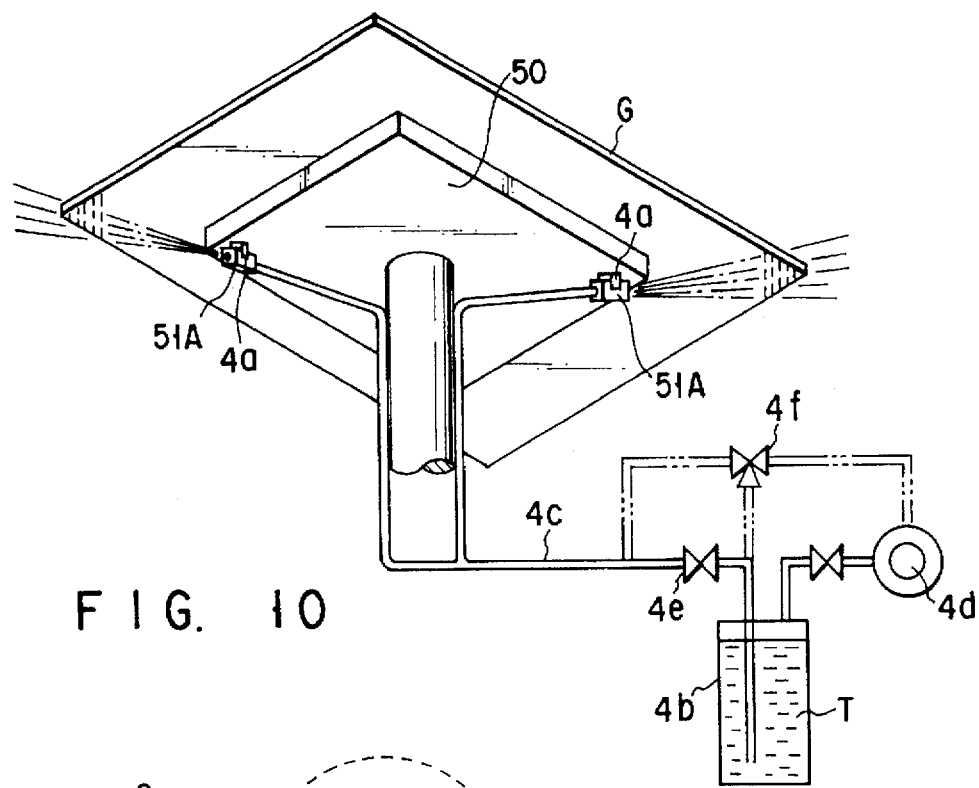
FIG. 10 is a block diagram showing the arrangement of auxiliary cleaning nozzles and a gas supply circuit.
Figure 11:
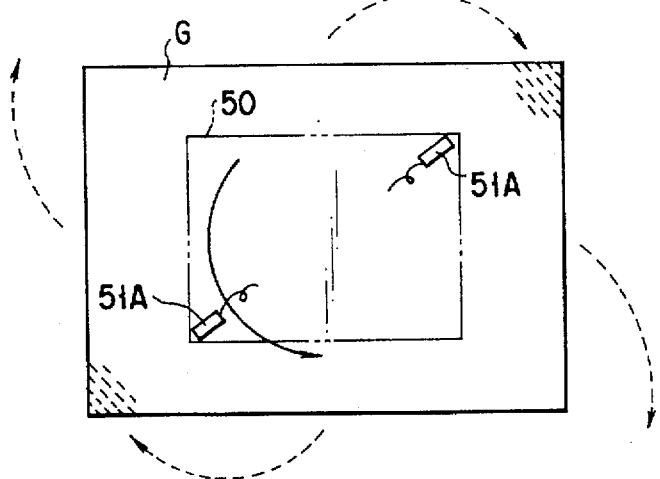
FIG. 11 is a plan view showing a variation of the auxiliary cleaning nozzles.
Figure 12:
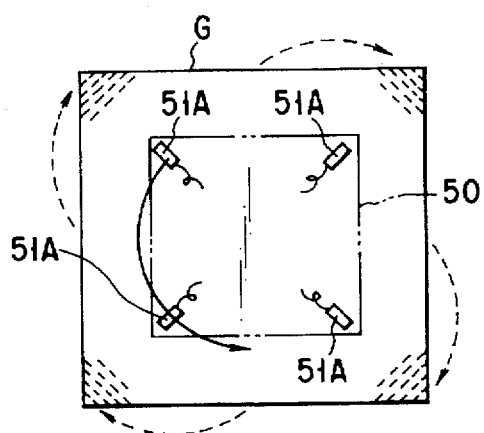
FIG. 12 is a plan view showing another variation of the auxiliary cleaning nozzles.
Figure 15:
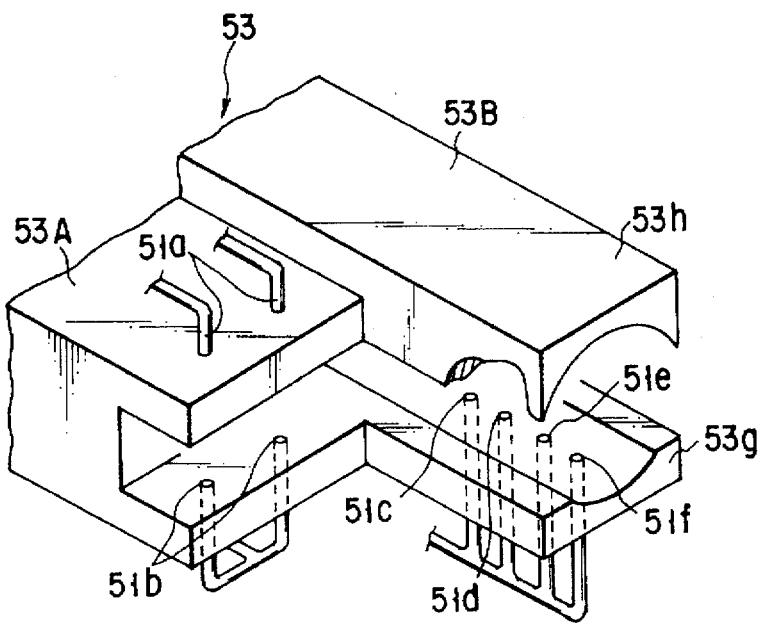
FIG. 15 is a perspective view showing a still further variation of the auxiliary cleaning nozzles.
Figure 16:
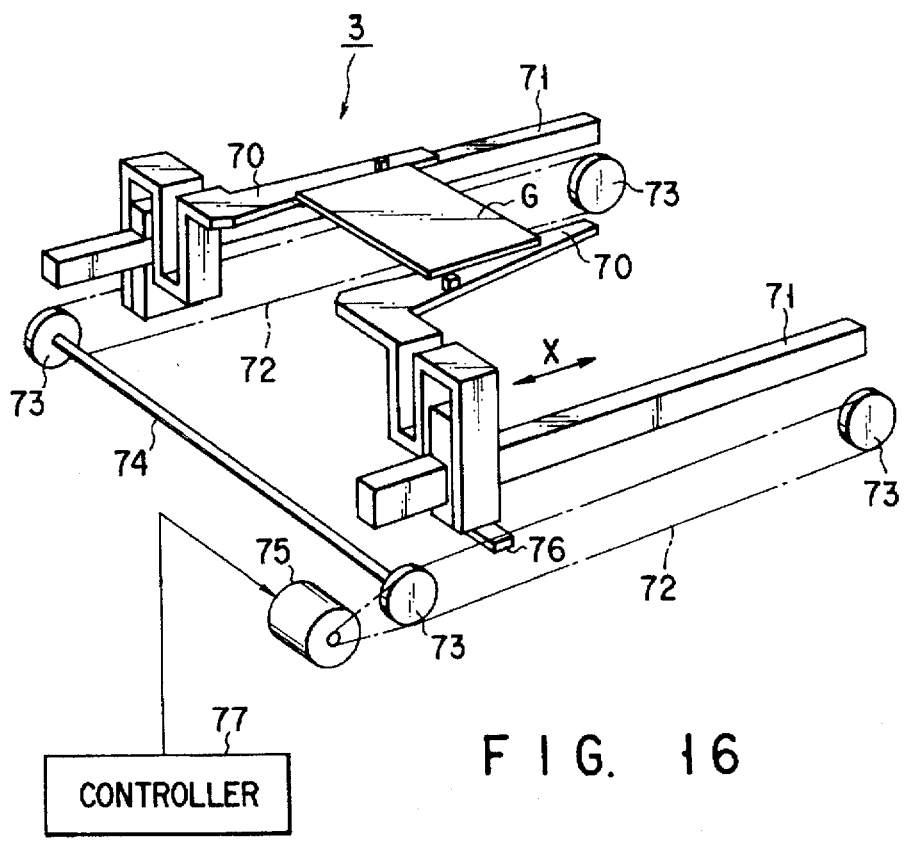
FIG. 16 is a block diagram showing a substrate carrier unit.

As shown in FIGS. 8 and 9, the removing nozzle assembly 51 has a jetting head 53, a solvent supply passage 53c, another solvent supply passage 53d, top cleaning nozzles 51a, and underside cleaning nozzles 51b. The jetting head 53 comprises upper and lower horizontal pieces 53a and 53b which have a fallen U section to sandwich the peripheral portions of the substrate G between them. The nozzles 51a and the solvent supply passage 53c are intended to remove resist film from the top of the substrate G and they are arranged in the upper horizontal piece 53a. The nozzles 51b and the solvent supply passage 53d are intended to remove resist film from the underside of the substrate G and they are arranged in the lower horizontal piece 53b.

The jetting tips of the nozzles 51a are directed downward and those of the nozzles 51b upward. The jetting tips of the upper nozzles 51a are shifted from those of the lower nozzles 51b not to cause removing liquid (or solvent) jetted through the upper ones to interfere with that jetted through the lower ones. This is because solvent is spread, when removing liquids jetted through upper and lower jetting tips interfere with each other, to thereby make the thickness of resist film formed on the top of the substrate G uneven.

As shown in FIG. 9, the interval at which the upper nozzles 51a are positioned is made smaller than that at which the lower ones 51b are positioned. An exhaust opening 53f is formed in a vertical side 53e of the jetting head 53 and an exhaust pipe 54 extends from it to the exhaust unit (not shown). Excess solvent is exhausted outside through the exhaust pipe 54.

As shown by two-dot and dash lines in FIG. 8, jetting tip portions of the upper nozzles 51a may be bent outward. When arranged so, liquid jetted through them is forced far from the substrate G not to adhere to the resist film in the center area of the substrate G. Same thing can be said about the lower nozzles 51b.

A pair of removing nozzles 51 are adjusted to face first and second opposed sides (or long and short sides) of the substrate G by a position adjuster mechanism 55. They are also moved up and down to their resist film removing and waiting positions by a lift mechanism 56 and right and left along the peripheral portions of the substrate G by a horizontal carrier mechanism 57. Plural removing nozzles 51 may be arranged in their moving direction at a certain pitch in this case.

The position adjuster mechanism 55 includes a cylinder body 59a, a reciprocating rod 59b, an air cylinder 59, outer and inner stoppers 60a and 60b. The cylinder body 59a is connected to the jetting head 53 of one removing nozzle 51 through an attaching member 58a. The reciprocating rod 59b is connected to the jetting head 53 of the other removing nozzle 51 through an attaching member 58b. When the rod 59b is slid forward, the attaching members 58a and 58b are struck against their corresponding outer stoppers 60a to position the removing nozzles 51 to face the long side portions of the substrate G. When the rod 59b is slid backward, they are struck against the inner stoppers 60b to position the removing nozzles 51 to face the short side portions of the substrate g. The removing nozzles 51 are supported by a support member 61 to which the cylinder body 59a is attached.

Referring to FIGS. 17A through 17E, a method of coating resist to the substrate G and removing it from the substrate G while using the above-described resist processing apparatus will be described.

The substrate G is carried into the coating unit 1 and mounted and suction-held on the spin chuck 10. As shown in FIG. 17A, resist solution is dropped onto the surface of the substrate G, the cap 16 is then closed and the spin chuck 10 is spin-rotated together with the rotary cup 12. As the result, the resist solution is spread all over the surface of the substrate G so that resist film having a substantially uniform thickness can be formed on it.

As shown in FIG. 17B, the substrate G is carried to the peripheral portion removing unit 2 by the carrier mechanism 3 and mounted and suction-held on the stage 50.

As shown in FIG. 17C, the carrier arms 70 are retreated and the removing nozzles 51 are set to sandwich the short side of the substrate G between them. Solvent (or thinner) is jetted to the top and underside of both long side portions of the substrate G while moving the removing nozzles 51 along the long sides thereof (first resist removing step). It is jetted in this case to cover an area of about 5 mm when measured from each long side rim of the substrate G. When it is being jetted in this manner, a next substrate G is resist-coated by the resist coating unit 1. After unnecessary resist film is removed from both long side portions of the substrate G, the stage 50 is rotated clockwise by 90° and both short side portions of the substrate G are positioned to face the removing nozzles 51. The stage 50 may be rotated clockwise by 270° or by 450°. It may be rotated anti-clockwise.

As shown in FIG. 17D, the air cylinder 59 of the position adjuster mechanism 55 is extended and the removing nozzles 51 are set to sandwich the long side of the substrate G between them. As shown in FIG. 17E, solvent is jetted to the top and underside of both short side portions of the substrate G to remove resist film from them while moving the removing nozzles 51 along them (second resist removing step). It is also jetted in this case to cover an area of about 5 mm when measured from each short side rim of the substrate G. The substrate G is then carried out and into a next process. As apparent from the above, resist can be removed from side peripheral portions of the substrate G immediately after resist film is coated on it.

During the first or second step, or before or after one of these steps, resist film which has adhered to the underside of side peripheral portions of the substrate G can be easily removed when solvent is jetted to it through auxiliary cleaning nozzles 51A and 51c–51f. When resist solutions R1 and R2 which have stuck to the underside of the substrate G at two opposed corners thereof as shown in FIG. 14 are to be removed, for example, liquid jetted through the nozzles 51c–51f is controlled as follows.

Description will be made about the removing nozzle 51 which is positioned right in FIG. 14 when the paired removing nozzles 51 are to be moved along long sides GL of the substrate G.

When resist solution R1 adheres like a triangle to the underside of the substrate G, having a length LS1 along a short side Gs of the substrate G and a length LL1 along a long side GL thereof, and when the nozzle is positioned adjacent to the rim of the short side Gs, solvent is jetted through all of the auxiliary nozzles 51c–51f as well as through the top and underside cleaning nozzles 51a and 51b to clean or wash the triangular resist solution R1 enough to cover the distance LS1. As the removing nozzle 51 is moved, the width of the liquid adhering area R1 becomes smaller than LS1. The auxiliary cleaning nozzles 51f, 51e and 51d are therefore successively stopped in this order not to jet solvent. When the nozzle is moved to the end of the distance LL1 along the long side GL, it passes over the liquid adhering area R1. The auxiliary cleaning nozzle 51c is therefore stopped not to jet solvent. The removing nozzle 51 is then moved along the long side GL while keeping only the underside cleaning nozzle 51b jetting solvent.

In the case of the left removing nozzle 51, no resist solution adheres to the underside of a corner which is opposed to the resist adhering corner R1 of the substrate G. Solvent is therefore jetted not through the auxiliary cleaning nozzles 51c–51f but through the top and underside cleaning nozzles 51a and 51b.

When the removing nozzle 51 comes near to the start of the distance LL2, solvent is jetted at first through the auxiliary cleaning nozzle 51c. A resist adhering area R2 is formed at an upper left corner of the substrate G on the underside thereof. The auxiliary cleaning nozzles 51d, 51e and 51f are therefore successively started in this order to jet solvent to cover a distance LS2.

When the resist removing from both long side portions of the substrate G is finished by the right and left removing nozzles 51, solvent jetting through the nozzles is stopped and the right and left removing nozzles 51 are retreated not to disturb the rotation of the substrate G. The substrate G is then rotated clockwise or anticlockwise by 90° and resist solution is to be removed from both short side portions of the substrate G. The resist solutions R1 and R2 have been removed from the underside of the substrate G. Solvent may be therefore jetted in this case only through the top and underside cleaning nozzles 51a and 51b.

The solvent jetting through the auxiliary cleaning nozzles 51c–51f can be controlled, as described above, to remove unnecessary resist film from those positions and areas on the underside of the substrate G to which resist solution has adhered. Unnecessary resist can be thus solved and removed while keeping the amount of solvent used as little as possible.

The main arm 80 which serves as substrate carrier will be described, referring to FIGS. 18 and 19.

The main arm 80 includes upper and lower fallen-U shaped arms 81a and 81b which can be reciprocated in the horizontal direction, independently of the other. The upper arm 81a is supported at its both sides by a pair of outer frames 83 which can slide along outer linear guides 82 opposed to each other. A timing belt (not shown) is stretched between an outer pulley 85 and a transmission pulley 85a so that the upper arm 81a can be driven by a first drive motor 84 through the pulley 85a. In short, the upper arm 81a is reciprocated when the first drive motor is rotated forward and backward. A pair of inner linear guides 86 are arranged inside the outer linear guides 82 and inner frames 87 are moved along the paired inner linear guides 86. The lower arm 81b is supported by the inner frames 87. A timing belt (not shown) is stretched between a drive pulley for a second motor 88 and an inner pulley 89a. The lower arm 81b is reciprocated when the second motor 88 is rotated forward and backward. Substrate holder claws 81c are erected on each of the arms 81a and 81b. As shown in FIG. 18, a sensor 150 is arranged adjacent to the arms 81a and 81b and it is detected by the sensor 150 whether or not substrates G are mounted on the arms 81a and 81b.

As shown in FIGS. 20 and 21, the brush cleaning unit 120 includes substrate carrier arms 121, by which the substrate G is held and carried horizontally (or right and left in FIGS. 20 and 21). A plurality of cleaning brushes 122, 123 and rinsing nozzles (not shown) are arranged above and below the substrate carrier passage. A substrate holder mechanism 124 is arranged at a position to which the substrate G is carried. The substrate carrier arms 121 are same as those of the carrier unit 3.

The jet water cleaning unit 130 includes a vessel 132 provided with a liquid exhaust opening 131, a substrate holder mechanism 133, a disc stage 134, a rinse liquid supply nozzle 135 and a cleaning water supply nozzle 136. Holder members 137 which are pressed against end faces of the substrate G are arranged on the disc stage 134.

It will be described how the substrate G is washed and cleaned by the brush and jet water cleaning units 120 and 130.

The substrate G is carried between the top cleaning brushes 122 and the underside cleaning brushes 123 and rinsing liquid (or pure water) is jetted to the substrate G while rotating the brushes 122 and 123. It is then carried to the jet water cleaning unit 130 and transferred onto the disc stage 134. The cleaning water supply nozzle 136 is moved above it to jet high pressure jet water to it. This cleaning process is carried out in this case while rotating it at low speed. The nozzle 136 is retreated while the nozzle 135 is moved above it to jet rinsing water to it.

Two or more sets of the resist coating and removing units 107 and 108 may be used. They may be arranged side by side or one upon the other in this case.

As shown in FIG. 23, four side portions of the substrate G may be processed at the same time by four removing nozzles 151A, 151B, 151C and 151D. They may be moved, synchronizing with one another, or independently of the others.

The removing nozzle 151A will be described as an example.

The removing nozzle 151A can move along a long side of the substrate G. It is attached to a slide member 153A which can slide along a guide rail 152A. The slide member 153A can be reciprocated along the axis Y by a carrier mechanism (not shown) which comprises a wire, a chain, a belt, a ball screw, a stepping motor, an air cylinder, an ultrasonic motor and a superconducting linear motor.

As shown in FIG. 24, the removing nozzle 151A includes an end face cleaning nozzle 151g for cleaning end faces of the substrate G, in addition to top and underside cleaning nozzles 151a and 151b. Each of the nozzles 151a and 151b has a switch valve arranged in its solvent supply passage. Therefore, its solvent supply can be stopped and started independently of the other and the amount of its solvent supplied can be controlled.

Further, gas jetting nozzles 154 and 153 are arranged in front of a jetting head 153 and above and below the substrate G, directing their tip portions toward the jetting head 153, that is, toward the peripheral portion of the substrate G. Gas thus jetted is exhausted through an exhaust pipe 156, passing through the jetting head 153.

Furthermore, dry gas jetting nozzles 157A and 158A are arranged on both sides of the removing nozzle 151A, as shown in FIG. 23, and they can be moved together with the removing nozzle 151A along the axis Y to jet dry gas to the top of the long side peripheral portion of the substrate G. They are arranged outside the substrate G but they may be positioned not to disturb the carry-in and -out of the substrate G.

The other removing nozzles 151B, 151C and 151D are substantially same in arrangement as the one 151A and they are arranged relative to a short side B, a long side C and a short side D, respectively.

It will be described how resist is removed from side peripheral portions of the substrate.

After resist film is formed, the substrate G is mounted and suction-held on a stage 159 of a removing unit 2A, positioning its long sides parallel to the direction Y and its short sides parallel to the direction X. The carrier arms 70 are retreated and the removing nozzles 151A, 151B, 151C and 151D are set to face four sides of the substrate G, respectively. Resist solvent is jetted to four side peripheral portions of the substrate G through them while moving them along the four sides thereof at the same time. Resist film can be thus removed from the four side peripheral portions of the substrate G.

The jetting of solvent may be controlled, depending upon the state of resist adhering to the peripheral portions of the substrate G. When no resist adheres to end faces and the lower surface of peripheral portions of the substrate G, solvent is jetted only through the top cleaning nozzle 151a.

When resist adheres even to the end face, solvent is further jetted through the end face cleaning nozzle 151g and when it adheres even to the underside of the side peripheral portion, solvent is still further jetted through the underside cleaning nozzle 151b.

If it is previously understood where resist film adheres to of the end face and the underside of side peripheral portion, solvent may be controlled to be jetted through the end face and underside cleaning nozzles 151g and 151b when the removing nozzle 151A passes over these resist-adhering areas. This enables the amount of solvent wasted to be reduced. In addition, this prevents the thickness of resist film on the top of the substrate from being changed.

When nitrogen ($N_2$) gas is jetted through the gas jetting nozzles 154 and 155 during the resist film removing process, $N_2$ gas flow directed to the peripheral portion of the substrate G and sucked into the jetting head 153 is created. Therefore, spreading resist is forced into the jetting head 153 to thereby prevent it from adhering to the surface of the substrate G. Solvent jetted through the top, end face and underside cleaning nozzles 151a, 151g and 151b and air bubbles caused can be thus prevented from adhering to the center area of the substrate G.

Prior to resist solving and removing through the removing nozzle 151A, heated $N_2$ gas is jetted to resist film on the peripheral portion of the substrate G through the dry gas nozzle 157A to dry it. Resist film can be thus prevented from becoming swelled at its edge after it is solved and removed.

Further, heated $N_2$ gas is jetted to the side peripheral portion of the substrate G through the dry gas nozzle 158A to dry the substrate G and resist film after the resist film is solved and removed. Solvent is immediately evaporated and the resist film is dried at its edge by this gas drying. The resist film is not unnecessarily solved and it is thus made stable at its edge.

Furthermore, the removing nozzles 151A and 151C may be attached to a common mechanism and the other removing nozzles 151B and 151D to another common mechanism. Or all of them may be attached to a common carrier mechanism. When they are attached to their independent carrier mechanisms, their moving speed may be controlled independently of the others, depending upon the state of resist adhering to side peripheral portions of the substrate G.

Still further, it may be arranged that the substrate G is held with its short sides kept parallel to the axis Y and that the removing nozzles 151A, 151B, 151C and 151D are set to face their corresponding sides of the substrate G.

Still further, the substrate G, solvent and $N_2$ gas may be controlled to have a temperature suitable for promoting the solving of resist film. The temperature of the substrate G can be controlled by controlling the temperature of atmosphere around it, supplying temperature-controlled gas to its top side, supplying temperature-controlled back gas to its underside, controlling the temperature of the stage 159 and by infrared rays and micro-waves.

The resist processing apparatus according to a second embodiment of the present invention will be described with reference to FIGS. 25 through 29C. Same components as those of the above-described first embodiment will be described only when needed.

Figure 25:
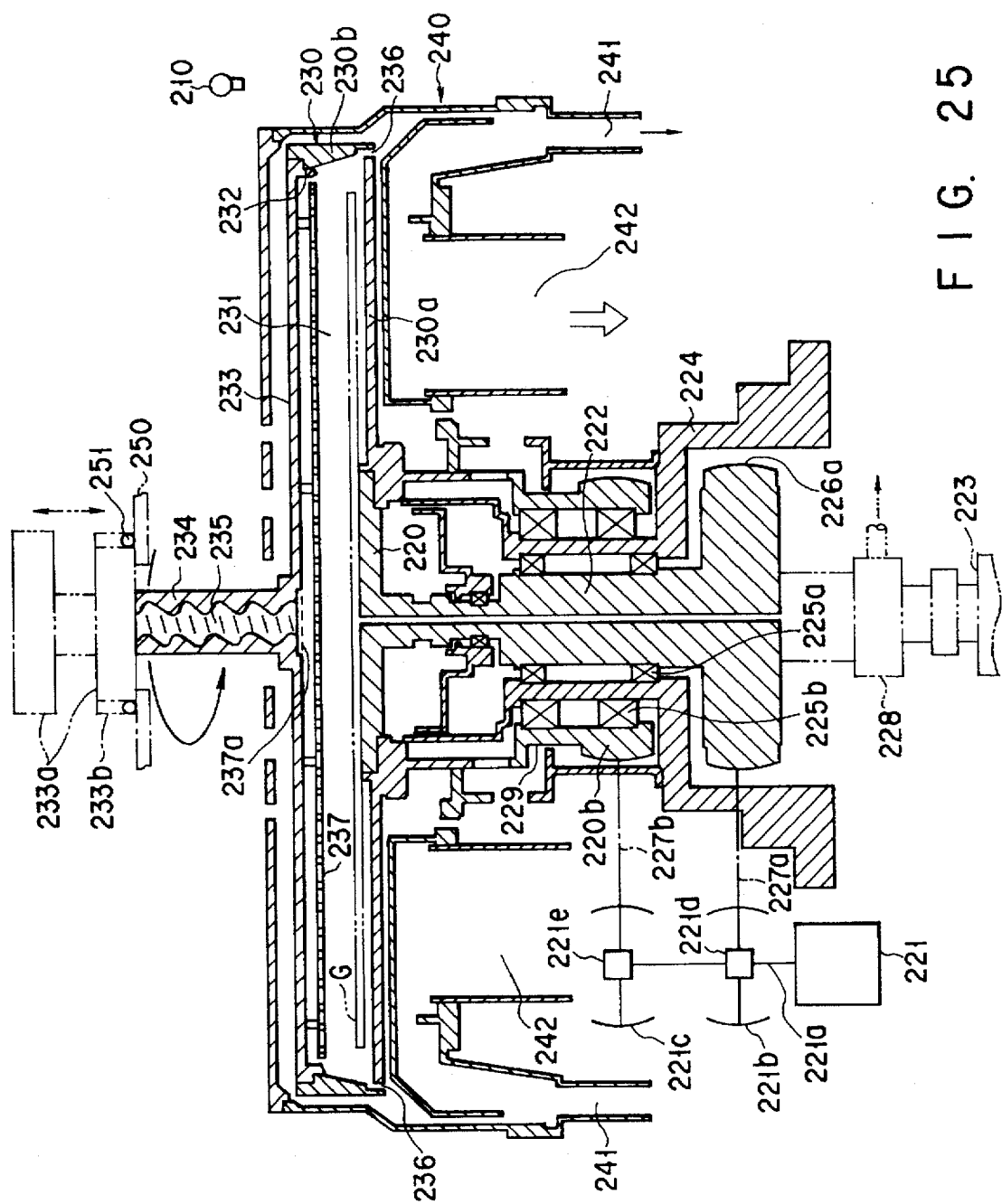
FIG. 25 is a vertically-sectioned view showing the process apparatus according to a second embodiment of the present invention.

As shown in FIG. 25, the second resist processing apparatus includes a coating nozzle 210, a spin chuck 220, a rotary cup 230, a cap 233 and a drain cup 240. The coating nozzle 210 is communicated with a resist solution supply source (not shown) provided with a flow rate and pressure control unit. It is movably supported by a carrier unit (not shown). The spin chuck 220 is substantially same as that of the above-described first embodiment. The rotary cup 230 encloses the spin chuck 220. When the rotary cup 230 is closed by a cap 233, a process space 231 is formed in them. The cap 233 is shaped to fit into a top opening of the rotary cup 230. The drain cup 240 encloses the rotary cup 230.

Figure 26:
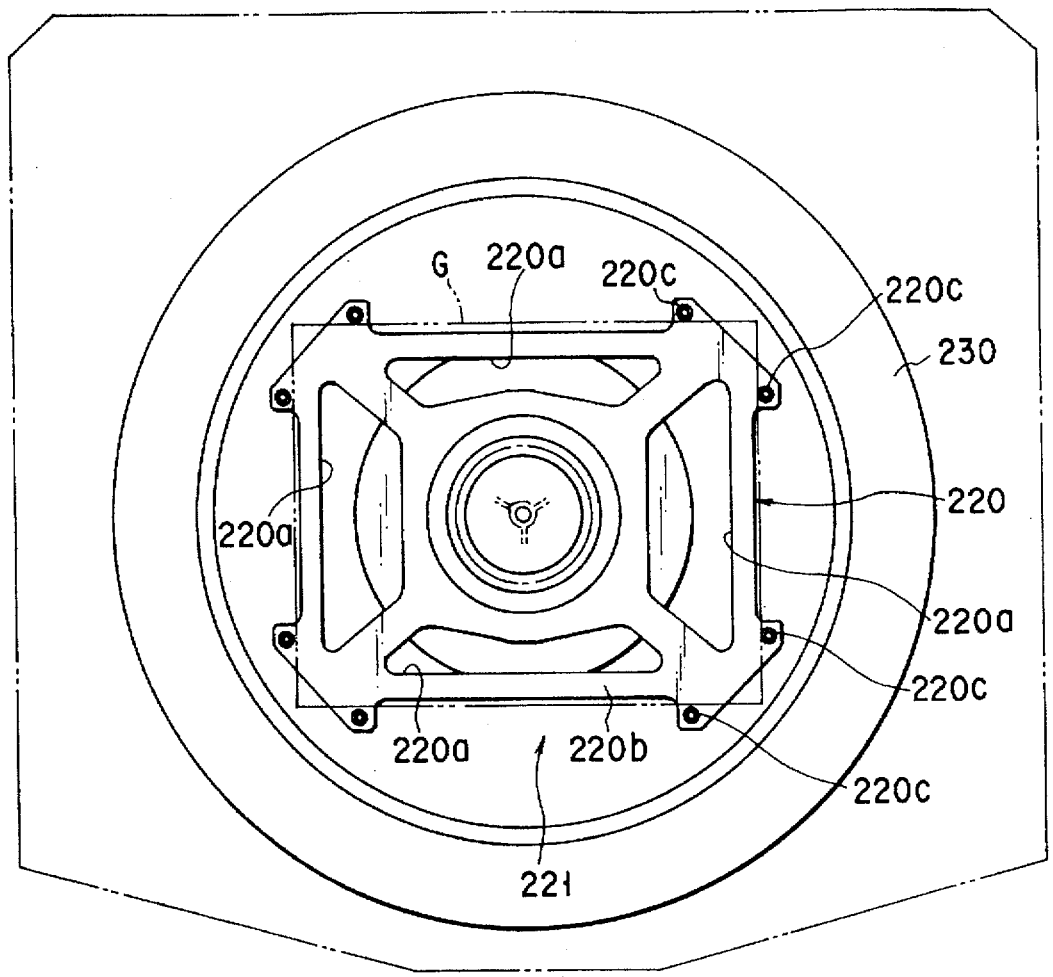
FIG. 26 is a plan view showing a main portion of the process apparatus.

As shown in FIG. 26, the main portion of the spin chuck 220 is a rectangular frame 220b and a window 220a is formed along each side of the frame 220b. Each corner of the frame 220b has a pair of support pieces 220c and each of these support pieces 220c is a rotatable roller. They are contacted with sides of the substrate G.

As shown in FIG. 25, a rotating shaft 222 for the spin chuck 220 is attached, slidable up and down, to a fixing sleeve 224 through a bearing 225a. A threaded driven pulley 226a is attached to the rotating shaft 222 and a threaded drive pulley 221b to a drive shaft 221a for a motor 221. A threaded belt 227a is stretched between the threaded driven and drive pulleys 226a and 221b. The lower end of the rotating shaft 222 is connected to a lifter cylinder 223 through a vacuum seal section 228 in a sleeve (not shown). The rotating shaft 222 is moved up and down by the lifter cylinder 223.

The rotary cup 230 is attached to a rotating sleeve 229 which is attached to the outer circumference of the fixing sleeve 224 through bearings 225b. A bearing (not shown) having sealing function is arranged between a cup bottom 230a and the underside of the spin chuck 220.

A threaded driven pulley 226b has a diameter same as that of the threaded driven pulley 226a. The rotary cup 230 and the spin chuck 220 are therefore rotated at a same rotation number, synchronizing with each other. Threaded drive pulleys 221b and 221c are attached to the drive shaft 221a through clutches 221d and 221e and when the clutches 221d and 221e are made operative, the threaded drive pulleys 221b and 221c are driven independently of the other.

As shown in FIG. 25, a shaft 234 is erected upward from the center of the top of the cap 233. An internal passage 235 is formed in the shaft 234 and it is communicated with the process space 231. Exhaust holes 236 are formed in the lower end of a cup side wall 230b. A buffer plate 237 is arranged between the cap 233 and the substrate G. It is larger than the substrate G and it is provided with a plurality of apertures. An auxiliary buffer plate 237a having filter function is arranged adjacent to that opening of the outside air introducing passage 235 through which the passage 235 is communicated with the process space 231.

On the other hand, a liquid exhaust opening 241 is formed in the bottom of the drain cup 240 along the outer wall thereof and an air exhaust opening 242 which is communicated with a vacuum pump (not shown) is formed inside the liquid exhaust opening 241.

When the motor 221 is driven, the rotary cup 230 is rotated so that outside air can flow into the process space 231 through the passage 235 and then into the exhaust opening 242 through the exhaust holes 236.

Figure 27:
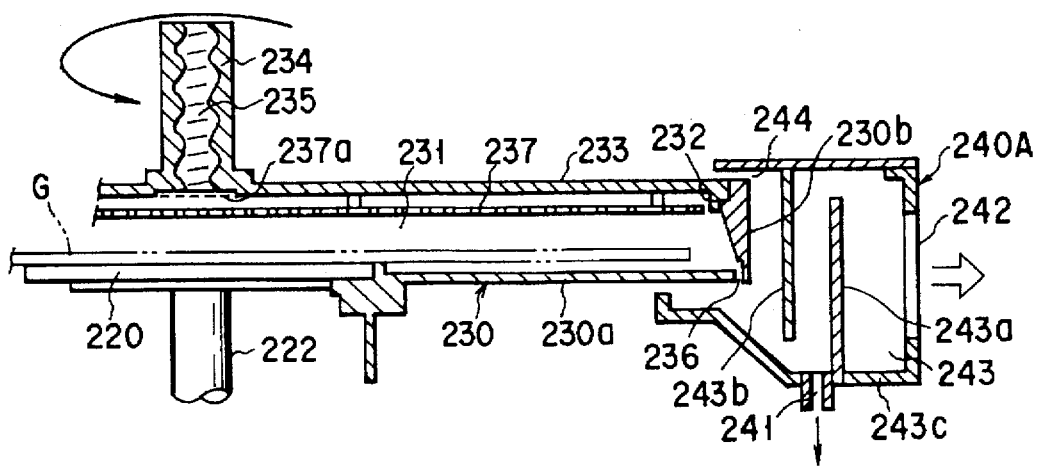
FIG. 27 is a partly-sectioned view showing a variation of the process apparatus.

As shown in FIG. 27, a hollow ring-shaped drain cup 240A may be arranged round the rotary cup 230. A ring-shaped passage 243 is formed in the drain cup 240A. It is communicated with a vacuum exhaust pump (not shown) through four exhaust openings 242. These exhaust openings 242 are formed in the outer circumferential wall of the drain cup 240A to make air exhaust uniform. Radical exhaust passages 244 which are communicated with the exhaust openings 242 may be formed between the top of the drain cup 240A and the outer circumferential wall 230b of the rotary cup 230.

Mist-like resist solution flows from the process space 231 into the drain cup 240 through exhaust holes 236 and then outside through the exhaust openings 242. It can be thus prevented from whirling up to the top side of the rotary cup 230.

The ring-shaped passage 243 is partitioned zigzag by outer and inner walls 243a and 243b. A liquid exhaust pipe 241 extends from the bottom of the drain cup 240 between the outer 243a and the inner wall 243b.

The cap 233 is rotated together with the rotary cup 230 during the resist treating process. When the cap 233 is to be opened and closed, robot arms 250 is positioned under a swelled head 233a on the top of the cap 233 to cause engaging pins 251 of the robot arms 250 to be engaged with engaged grooves 233b of the swelled head 233. The aligning of the engaging pins 251 with the engaged grooves 233b when the cap 233 is to be opened and the aligning of the fixing pins with the recesses when the cap 233 is to be closed are achieved by controlling the rotation angle of the servomotor 221.

As shown in FIG. 28, the outside air introducing passage 235 is shaped like a screw thread. This shape of the passage 235 enables a lot of outside air to be taken into the process space 231. The passage 235 may have a spiral groove or it may have no groove.

A method of coating resist to the substrate G while using the above-described second apparatus will be described with reference to FIGS. 29A through 29C.

As shown in FIG. 29A, a predetermined amount of resist solution is dropped onto the substrate G on the spin chuck 220 through the nozzle 210 while keeping the cap 233 opened. Temperature and composition of the resist solution are controlled. The nozzle 210 is retreated and the opening 232 of the rotary cup 230 is closed by the cap 233.

Figure 29B:
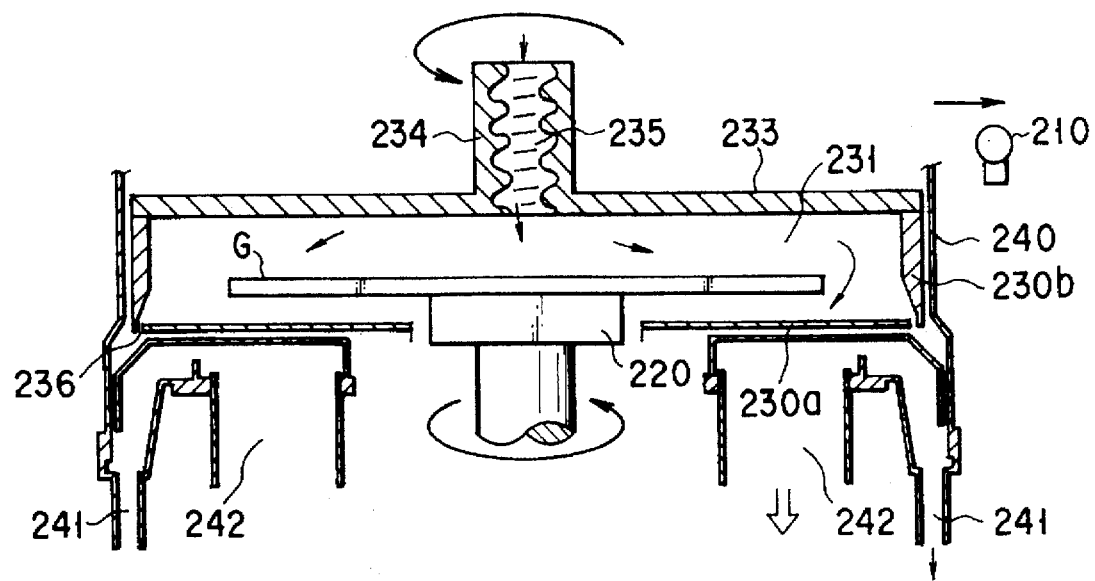

As shown in FIG. 29B, the rotary cup 230 is rotated together with the spin chuck 220 to spread resist on the top of the substrate G. Outside air is introduced this time into the process space 231 through the passage 235. This air introduced flows from the center to the outer rim of the substrate G and then into the exhaust opening 242 through the exhaust holes 236. This causes mist-like resist solution not to head for the center of the substrate G, thereby preventing the substrate G from being contaminated. The coated resist can be thus kept clean and the thickness of resist film can be also kept uniform.

Figure 29C:
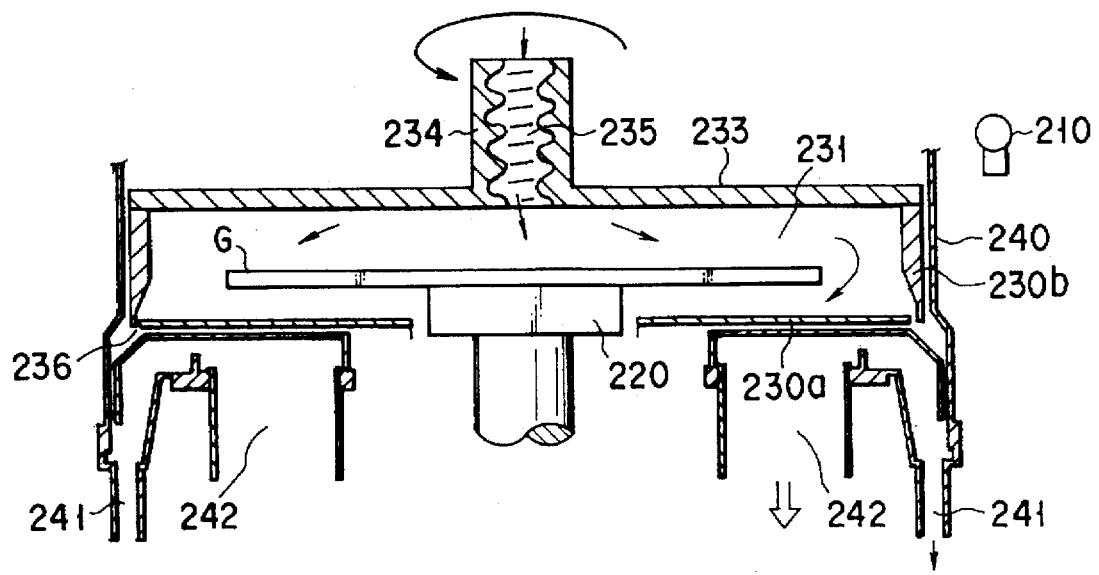

As shown in FIG. 29C, the rotation of the spin chuck 220 is stopped and only the rotary cup 230 is rotated after the resist coating process. Outside air is introduced this time into the process space 231 through the outside air introducing passage 235 while stayed mist-like resist is exhausted outside the process space 231. A part of resist mist is exhausted outside through the liquid exhaust opening 241 and a part of the other resist mist outside through the air exhaust opening 242. When only the rotary cup 230 is rotated for a predetermined time period, the coating process is finished.

According to the above-described method, outside air is introduced into the process space during the resist coating process. Therefore, mist-like resist can be prevented from adhering to the substrate and resist coated can be uniformly dried. This enables resist film to have a uniform thickness.

According to the above-described method, outside air is introduced into the process space to replace the air in it even after the resist coating process is finished. Therefore, no mist-like resist is left in it to thereby prevent particles from being caused.

According to the above-described apparatus, outside air can be introduced into the process space as the rotary cup is rotated. Therefore, mist-like resist can be prevented from adhering to the substrate during the resist coating process. This enables resist film to have a uniform thickness.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An apparatus for coating resist on a rectangular substrate for liquid crystal display and removing a part of the resist, comprising:

resist coating means for forming a resist film on at least one side of the substrate by spin-rotating the substrate and applying a resist solution to the substrate;

resist removing means arranged to be spaced from said resist coating means to remove coated resist from the substrate; and carrier means for carrying the substrate between the resist coating means and the resist removing means, wherein said resist removing means includes:

nozzle means for jetting removing liquid, which can dissolve resist, to peripheral portions of the substrate, moving means for moving the nozzle means along the peripheral portions of the substrate, and exhausting means in communication with said resist removing means for discharging air around peripheral portions of the substrate to generate an air flow flowing from the peripheral portions of the substrate to an outside of the substrate; and said removing liquid jetted from said nozzle means strips the resist off the peripheral portions of the substrate and discharges the resist by said air flow to the outside of the substrate.

2. The resist processing apparatus according to claim 1, wherein said resist removing means further includes holder means for holding the substrate and means for rotating the holder means together with the substrate.

3. The resist processing apparatus according to claim 1, wherein said nozzle means includes main cleaning nozzles arranged movable along peripheral portions of the substrate to jet removing liquid to both surfaces of the substrate at the peripheral portions thereof and auxiliary cleaning nozzles for jetting removing liquid to a lower surface of the substrate at corners thereof.

4. The resist processing apparatus according to claim 3, wherein said main cleaning nozzles include a plurality of nozzle members arranged to face upper and lower surfaces of the substrate at the peripheral portions, and said nozzle members are arranged in a tandem manner with intervals arranged therebetween to prevent the removing liquid jetted through each of the nozzle members from interfering with other nozzle members.

5. The apparatus for coating resist according to claim 1, wherein said removing liquid is selected from the group consisting of thinner, acetone, methyl ethyl ketone, butyl acetate and ethyl lactic acid.

6. An apparatus for coating resist on a rectangular substrate for liquid crystal display, comprising:

a spin chuck for holding and rotating the substrate;

supplying means for supplying resist solution to the substrate on the spin chuck;

a rotary cup rotatably arranged so as to contain the substrate on the spin chuck, the rotary cup having a discharging hole for discharging the resist solution centrifugally removed from the substrate and being formed to have a larger outer diameter at a lower portion than that of an outer diameter at an upper portion, and the discharging hole being formed at the lower portion of the rotary cup;

a drain cup containing at least output periphery of the rotary cup to receive the resist solution discharged from the rotary cup through the discharging hole;

exhaust means connected to said drain cup for exhausting the drain cup;

means provided at the upper portion of the rotary cup to introduce an outside air into the rotary cup, wherein the rotary cup is exhausted while introducing the outside air into the rotary cup to generate air flow flowing above the substrate which is being resist coated and directed from a center to an outer rim of the substrate and discharging resist drifting in the rotary cup from the rotary cup to the drain cup by the air flow.

7. The resist processing apparatus according to claim 6, wherein a screw- or spiral-threaded passage extends from an upper portion of the process vessel to introduce the outside air into the process vessel is rotated.

* * * * *